(12) United States Patent
Endo et al.

(10) Patent No.: US 8,465,837 B2
(45) Date of Patent: Jun. 18, 2013

(54) EPOXY RESIN COMPOSITION, PREPREG, LAMINATE BOARD, MULTILAYER PRINTED WIRING BOARD, SEMICONDUCTOR DEVICE, INSULATING RESIN SHEET, AND PROCESS FOR MANUFACTURING MULTILAYER PRINTED WIRING BOARD

(75) Inventors: Tadasuke Endo, Tokyo (JP); Akihito Takahashi, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 611 days.

(21) Appl. No.: 12/531,308

(22) PCT Filed: Apr. 9, 2008

(86) PCT No.: PCT/JP2008/000914
§ 371 (c)(1),
(2), (4) Date: Feb. 23, 2010

(87) PCT Pub. No.: WO2008/126411
PCT Pub. Date: Oct. 23, 2008

(65) Prior Publication Data
US 2010/0227170 A1  Sep. 9, 2010

(30) Foreign Application Priority Data

Apr. 10, 2007 (JP) ................................. 2007-103104
Oct. 26, 2007 (JP) ................................. 2007-279234

(51) Int. Cl.
| | |
|---|---|
| B32B 27/38 | (2006.01) |
| B32B 27/04 | (2006.01) |
| C08L 63/00 | (2006.01) |
| H01L 23/00 | (2006.01) |

(52) U.S. Cl.
USPC ........ 428/416; 428/297.4; 428/413; 428/901; 523/457; 523/458; 523/466

(58) Field of Classification Search
None
See application file for complete search history.

(56) References Cited

U.S. PATENT DOCUMENTS

| | | | | |
|---|---|---|---|---|
| 7,655,871 | B2* | 2/2010 | Arai et al. .................. | 174/258 |
| 2003/0148107 | A1* | 8/2003 | Suzuki et al. .................. | 428/413 |
| 2003/0152776 | A1* | 8/2003 | Kiuchi et al. .................. | 428/413 |
| 2007/0203308 | A1* | 8/2007 | Mori et al. .................. | 525/524 |
| 2008/0187763 | A1* | 8/2008 | Kato et al. .................. | 428/418 |
| 2008/0254300 | A1 | 10/2008 | Arai et al. | |
| 2009/0054585 | A1* | 2/2009 | Ogura et al. .................. | 524/541 |

FOREIGN PATENT DOCUMENTS

| | | |
|---|---|---|
| CN | 1938358 | 3/2007 |
| JP | 2002-299834 | 10/2002 |
| JP | 2002-305374 | 10/2002 |
| JP | 2003-064198 | 3/2003 |
| JP | 2003-128928 | 5/2003 |
| JP | 2003-213019 | 7/2003 |
| JP | 2003-268136 | 9/2003 |
| JP | 2006-274236 | 10/2006 |
| WO | WO 2005/092945 | 10/2005 |
| WO | WO 2006093203 A1 * | 9/2006 |

OTHER PUBLICATIONS

Chinese Office Action for corresponding CN Application No. 200880011605.3, Apr. 13, 2011.

* cited by examiner

*Primary Examiner* — Michael J Feely
(74) *Attorney, Agent, or Firm* — Ditthavong Mori & Steiner, P.C.

(57) ABSTRACT

Disclosed is an epoxy resin composition essentially containing (A) an epoxy resin having a structure represented by the general formula (1), (B) a curing agent, (C) an inorganic filler and (D) a cyanate resin and/or a prepolymer thereof, wherein Ar represents a fused aromatic hydrocarbon group; r is an integer of 1 or more; X is a hydrogen or an epoxy group (glycidyl ether group); $R_1$ represents one selected from the group consisting of a hydrogen, a methyl group, an ethyl group, a propyl group, a butyl group, a phenyl group and a benzyl group; n is an integer of 1 or more; p and q are an integer of 1 or more; and p's and q's in respective repeating units may be the same as or different from one another.

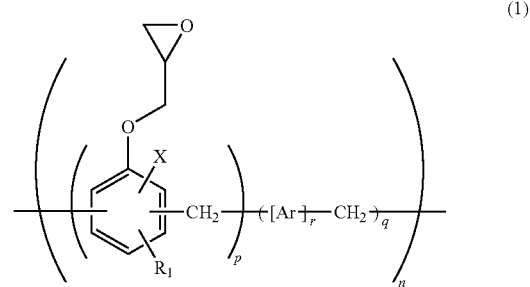

(1)

22 Claims, 2 Drawing Sheets

EPOXY RESIN COMPOSITION, PREPREG, LAMINATE BOARD, MULTILAYER PRINTED WIRING BOARD, SEMICONDUCTOR DEVICE, INSULATING RESIN SHEET, AND PROCESS FOR MANUFACTURING MULTILAYER PRINTED WIRING BOARD

TECHNICAL FIELD

The present invention relates to an epoxy resin composition, a prepreg, a laminated board, a multilayer printed wiring board, a semiconductor device, an insulating resin sheet and a process for manufacturing a multilayer printed wiring board.

BACKGROUND ART

With recent variation, size reduction and thinning of electronic components, electronic devices and so on, multilayer printed wiring boards used in them have been size-reduced and thinned, and various configurations have thus been developed. In general, a multilayer printed wiring board is manufactured by forming a circuit in a double-sided metal-foil clad laminated board by a method such as etching, laminating an insulating resin layer, forming a circuit on the surface of the insulating resin layer and further laminating an insulating resin layer, and manufactured by alternately laminating circuits and insulating resin layers.

A double-sided metal-foil clad laminated board is generally formed by impregnating a base material such as a glass cloth with, for example, a thermosetting resin such as an epoxy resin and a phenol resin by immersion to form an insulating layer called as a prepreg and laminating metal foils such as copper foils on both sides of the prepreg or of both sides of multiple laminated prepregs, and the laminate is heated and pressed.

Following such a trend of thinning of a multilayer printed wiring board, there has been investigated thinning or eliminating a prepreg in a double-sided metal-foil clad laminated board.

However, when a semiconductor device is manufactured using a thin multilayer printed wiring board, a connection between a semiconductor element and the multilayer printed wiring board may be subjected to stress due to a difference in linear thermal expansion, which may adversely affect reliability of a semiconductor device. Therefore, a resin composition used in an insulating resin layer in a prepreg or multilayer printed wiring board must have a low expansion coefficient. A resin composition generally contains an epoxy resin, and an expansion coefficient of the resin composition is reduced by adding an inorganic filler and a cyanate resin to the resin composition containing an epoxy resin.

Patent Reference No. 1: Japanese published unexamined application No. 2003-64198.
Patent Reference No. 2: Japanese published unexamined application No. 2002-305374.
Patent Reference No. 3: Japanese published unexamined application No. 2002-299834.
Patent Reference No. 4: Japanese published unexamined application No. 2003-128928.
Patent Reference No. 5: Japanese published unexamined application No. 2006-274236.

DISCLOSURE OF THE INVENTION

A thermal linear expansion coefficient of a resin composition can be reduced by using an inorganic filler and a cyanate resin. However, it may lead to defective appearance as a streak which appears to be a trace of resin flowing in the surface of an insulating resin layer such as a prepreg. It may be probably caused by difference in flow properties between the inorganic filler and the resin component or incompatibility between the epoxy resin and the cyanate resin, which results in separation of the resin component from the inorganic filler.

Although it may be speculated that a resin composition may be made more viscous for preventing a streak from forming, it may lead to a new problem of deterioration in moldability of the resin composition.

An objective of the present invention is to provide an epoxy resin composition, a prepreg, a laminated board, a multilayer printed wiring board, a semiconductor device, an insulating resin sheet and a process for manufacturing a multilayer printed wiring board, in which a linear expansion coefficient can be reduced, defective appearance can be prevented and excellent moldability can be achieved.

Such an objective can be achieved by the present invention as described in the following [1] to [23].

[1] An epoxy resin composition comprising, as essential components, an epoxy resin having a structure represented by general formula (1) (A), a curing agent (B), an inorganic filler (C), and a cyanate resin and/or a prepolymer of the cyanate resin (D).

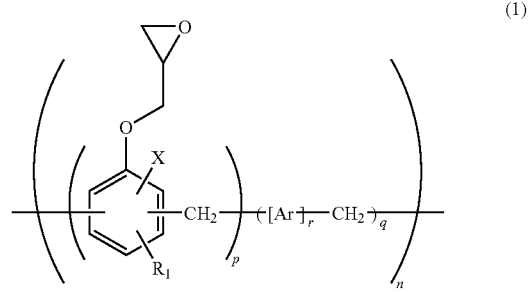

wherein Ar represents a fused aromatic hydrocarbon group; r is an integer of 1 or more; X represents a hydrogen or an epoxy group (glycidyl ether group); $R_1$ represents one selected from the group consisting of a hydrogen, a methyl group, an ethyl group, a propyl group, a butyl group, a phenyl group and a benzyl group; n is an integer of 1 or more; p, q is an integer of 1 or more; p's and q's in respective repeating units may be the same as or different from one another.

[2] The epoxy resin composition as described in [1], wherein the fused aromatic hydrocarbon group [Ar] in said epoxy resin having a structure represented by general formula (1) is one selected from the group consisting of the structures represented by formulas (Ar1) to (Ar4).

(2)

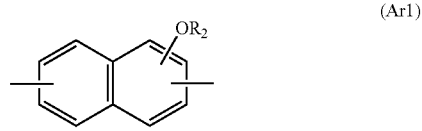

-continued

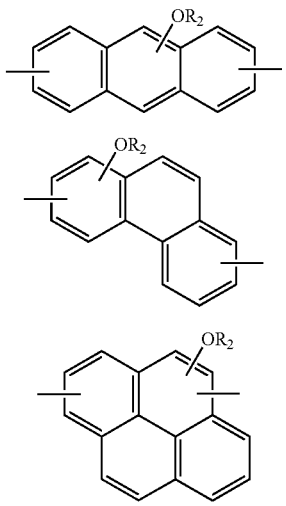

wherein $R_2$ represents one selected from the group consisting of a hydrogen atom, a methyl group, an ethyl group, a propyl group, a butyl group, a phenyl group and a benzyl group.

[3] The epoxy resin composition as described in [1] or [2], wherein said inorganic filler (C) is at least one selected from the group consisting of magnesium hydroxide, aluminum hydroxide, silica, talc, calcined talc and alumina.

[4] The epoxy resin composition as described in any of [1] to [3], wherein a content of (A) said epoxy resin is 1% by weight to 20% by weight to the total amount of the resin composition.

[5] The epoxy resin composition as described in any of [1] to [4], wherein the epoxy resin composition has a minimum melt viscosity of $2 \times 10^2$ (Pa·s) or less.

[6] The epoxy resin composition as described in any of [1] to [5], wherein a content of said inorganic filler (C) is 20% by weight to 85% by weight to the total amount of the resin composition.

[7] The epoxy resin composition as described in any of [1] to [6], wherein said cyanate resin (D) is a novolac type cyanate resin.

[8] The epoxy resin composition as described in any of [1] to [7], wherein a content of said cyanate resin and/or prepolymer of the cyanate resin (D) is 3% by weight to 46% by weight to the total amount of the resin composition.

[9] A prepreg prepared by impregnated a base material with the epoxy resin composition as described in any of [1] to [8].

[10] A laminated board prepared by laminating one or more of the prepregs as described in [9].

[11] A multilayer printed wiring board comprising the prepreg as described in [9] or the laminated board as described in [10].

[12] A semiconductor device comprising the multilayer printed wiring board as described in [11].

[13] An insulating resin sheet prepared by forming an insulating resin layer made of a resin composition comprising, as essential components, an epoxy resin having a structure represented by general formula (1) (A), a curing agent (B), an inorganic filler (C) and a cyanate resin and/or a prepolymer of the cyanate resin (D), over a carrier film or metal foil.

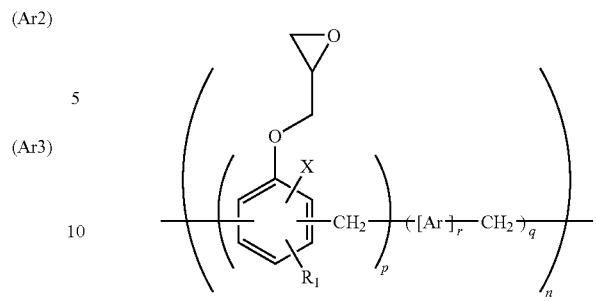

wherein Ar represents a fused aromatic hydrocarbon group; r is an integer of 1 or more; X represents a hydrogen or an epoxy group (glycidyl ether group); $R_1$ represents one selected from the group consisting of a hydrogen, a methyl group, an ethyl group, a propyl group, a butyl group, a phenyl group and a benzyl group; n is an integer of 1 or more; p, q is an integer of 1 or more; p's and q's in respective repeating units may be the same as or different from one another.

[14] The insulating resin sheet as described in [13], wherein the fused aromatic hydrocarbon group [Ar] in said epoxy resin having a structure represented by general formula (1) (A) is one selected from the group consisting of the structures represented by formulas (Ar1) to (Ar4).

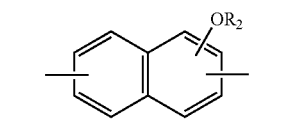

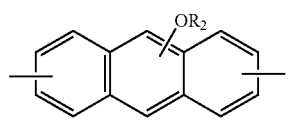

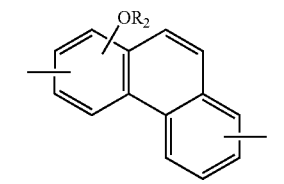

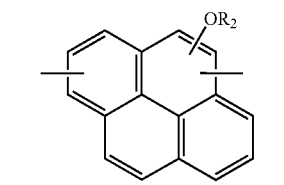

wherein $R_2$ represents one selected from the group consisting of a hydrogen atom, a methyl group, an ethyl group, a propyl group, a butyl group, a phenyl group and a benzyl group.

[15] The insulating resin sheet as described in [13] or [14], wherein said resin composition further comprises a phenoxy resin.

[16] The insulating resin sheet as described in any of [13] to [15], wherein a content of said epoxy resin (A) is 1 by weight to 20% by weight to the total amount of the resin composition.

[17] The insulating resin sheet as described in any of [13] to [16], wherein said inorganic filler (C) is at least one selected from the group consisting of magnesium hydroxide, aluminum hydroxide, silica, talc, calcined talc and alumina.

[18] The insulating resin sheet as described in any of [13] to [17], wherein a content of said inorganic filler (C) is 20 to 85% by weight of the resin composition.

[19] A process for manufacturing a multilayer printed wiring board comprising laminating the insulating resin sheet as described in any of [13] to [18] on the surface of the inner circuit board having an inner circuit pattern, and forming an outer circuit in said insulating resin layer in said insulating resin sheet.

[20] The process for manufacturing a multilayer printed wiring board as described in [19], wherein said step of laminating said insulating resin sheet on the surface of the inner circuit board having an inner circuit pattern is laminating under heating and pressure in vacuo.

[21] A multilayer printed wiring board comprising the insulating resin sheet as described in any of [13] to [18] and an inner circuit board in which said insulating resin sheet is laminated to the surface having a circuit pattern.

[22] A semiconductor device comprising the multilayer printed wiring board as described in [21], in which a semiconductor element is mounted.

[23] An epoxy resin composition for sheet comprising, as essential components, an epoxy resin having a structure represented by general formula (1) (A), a curing agent (B), an inorganic filler (C) and a cyanate resin and/or a prepolymer of the cyanate resin (D).

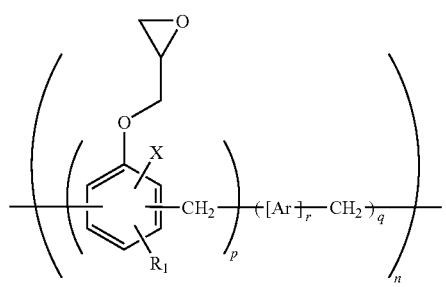

(1)

wherein Ar represents a fused aromatic hydrocarbon group; r is an integer of 1 or more; X represents a hydrogen or an epoxy group (glycidyl ether group); $R_1$ represents one selected from the group consisting of a hydrogen, a methyl group, an ethyl group, a propyl group, a butyl group, a phenyl group and a benzyl group; n is an integer of 1 or more; p, q is an integer of 1 or more; p's and q's in respective repeating units may be the same as or different from one another.

The present invention can provide a resin composition and so forth, in which an expansion coefficient can be reduced, defective appearance can be prevented and moldability can be improved.

BRIEF DESCRIPTION OF THE DRAWINGS

The above objective, and additional objectives, characteristics and advantages will be further understood with reference to suitable embodiments described below and the accompanying drawings.

BEST MODE FOR CARRYING OUT THE INVENTION

Figure 1:
FIG. 1 shows a laminated board in accordance with the first embodiment of the present invention.

There will be described embodiments of the present invention.
First Embodiment

For this embodiment, there will be described the constitution of a resin composition used for a prepreg, a prepreg and so on.

The resin composition contains, as essential components, an epoxy resin (A), a curing agent (B), an inorganic filler (C) and a cyanate resin and/or a prepolymer of the cyanate resin (D).

(A) The epoxy resin used for the resin composition has a structure represented by general formula (1).

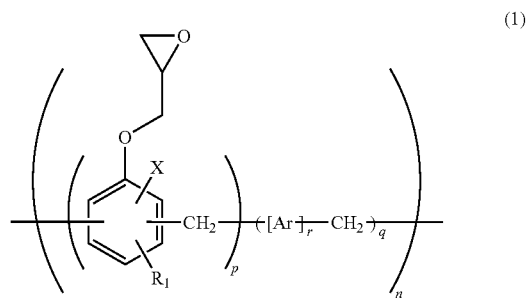

(1)

wherein Ar represents a fused aromatic hydrocarbon group; r is an integer of 1 or more; X represents a hydrogen or an epoxy group (glycidyl ether group); $R_1$ represents one selected from the group consisting of a hydrogen, a methyl group, an ethyl group, a propyl group, a butyl group, a phenyl group and a benzyl group; n is an integer of 1 or more; p, q is an integer of 1 or more; p's and q's in respective repeating units may be the same as or different from one another.

The use of the epoxy resin (A) allows for improvement in compatibility between the epoxy resin (A) and the cyanate resin (D), for improvement in dispersibility of the inorganic filler (C) in the resin component, and for preventing separation of the resin component from the inorganic filler (C). Thus, the cyanate resin (D) and the inorganic filler (C) can be used not only to reduce a linear expansion coefficient but also to prevent streak irregularity and to give a flat surface during a sheet material such as a prepreg is prepared.

In addition, the use of the epoxy resin (A) allows the composition to have a lower melt viscosity even when it contains the inorganic filler (C). Thus, processability can be improved when a laminated board or the like is manufactured.

When a melt viscosity is lowered using an epoxy resin having a different structure instead of the epoxy resin (A), a sheet molding such as a prepreg more frequently has streak irregularity.

The epoxy resin (A) maybe represented by formula (1), wherein Ar represents a fused aromatic hydrocarbon group and r is an integer of 1 or more. X represents a hydrogen or an epoxy group (glycidyl ether group) and $R_1$ represents one selected from the group consisting of a hydrogen, a methyl group, an ethyl group, a propyl group, a butyl group, a phenyl group and a benzyl group. Then, n is an integer of 1 or more. Furthermore, each of p and q is an integer of 0 or more, but p=q=0 never holds and the epoxy resin (A) contains at least one repeating unit in which p is one or more and q is one or more.

The fused aromatic hydrocarbon group [Ar] is preferably one selected from the group consisting of the structures represented by formulas (Ar1) to (Ar4).

(2)

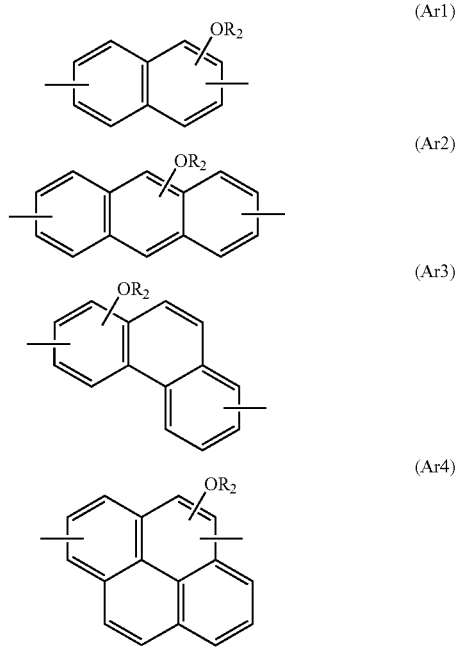

(Ar1)

(Ar2)

(Ar3)

(Ar4)

wherein $R_2$ represents one selected from the group consisting of a hydrogen atom, a methyl group, an ethyl group, a propyl group, a butyl group, a phenyl group and a benzyl group.

Formula (Ar1) is more preferable, and formula (Ar1) in which $R_2$ is methyl group is particularly preferable. Such a structure may lead to improvement in an appearance and embedding properties during press molding and improvement in moldability.

A content of the epoxy resin (A) is preferably, but not limited to, 1 to 20% by weight, particularly preferably 5% by weight or less to the total amount of the resin composition.

A content of less than 1% by weight may cause separation of an inorganic filler component from the resin component while a content of more than 20% by weight may lead to deterioration in flame resistance.

The curing agent (B) in the resin composition is preferably, but not limited to, a phenol resin or a hardening accelerator. A phenol resin and a hardening accelerator may be combined.

Examples of the phenol resin include, but not particularly limited to, novolac type phenol resins such as phenol novolac resins, cresol novolac resins, bisphenol-A novolac resins and arylalkylene type novolac resins; and resol-type phenol resins such as unmodified resol-type phenol resins and oil-modified resol-type phenol resins modified by an oil such as a tung oil, a linseed oil and a walnut oil. These can be used alone, in combination of two or more having different weight-average molecular weights, or one or two or more of the above resins can be combined with their prepolymers. Among these, an arylalkylene type phenol resin is particularly preferable. Thus, solder heat resistance after moisture absorption can be improved.

Examples of the hardening accelerator include, but not particularly limited to, organometallic salts such as zinc naphthenate, cobalt naphthenate, tin octylate, cobalt octylate, bis(acetylacetonate) cobalt (II) and tris(acetylacetonate) cobalt (III); tertiary amines such as triethylamine, tributylamine and diazabicyclo[2,2,2]octane; imidazoles (imidazole compounds) such as 2-methylimidazole, 2-phenylimidazole, 2-phenyl-4-methylimidazole, 2-ethyl-4-ethylimidazole, 1-benzyl-2-methylimidazole, 1-benzyl-2-phenylimidazole, 2-undecylimidazole, 1-cyanoethyl-2-ethyl-4-methylimidazole, 1-cyanoethyl-2-undecylimidazole, 2-phenyl-4-methyl-5-hydroxyimidazole, 2-phenyl-4,5-dihydroxyimidazole and 2,3-dihydro-1H-pyrrolo(1,2-a)benzimidazole; phenol compounds such as phenol, bisphenol-A and nonylphenol; organic acids such as acetic acid, benzoic acid, salicylic acid and para-toluenesulfonic acid; and a mixture of these. Including their derivatives, these may be used alone or in combination of two or more.

Among these hardening accelerators, an imidazole compound is particularly preferable. Thus, insulating performance and solder heat resistance can be improved when a resin composition is used as a prepreg for a semiconductor device.

Examples of the imidazole compound may include 1-benzyl-2-methylimidazole, 1-benzyl-2-phenylimidazole, 2-phenyl-4-methylimidazole, 2-ethyl-4-methylimidazole, 2,4-diamino-6-[2'-methylimidazolyl-(1')]-ethyl-s-triazine, 2,4-diamino-6-(2'-undecylimidazolyl)-ethyl-s-triazine, 2,4-diamino-6-[2'-ethyl-4-methylimidazolyl-(1')]-ethyl-s-triazine, 2-phenyl-4,5-dihydroxymethylimidazole and 2-phenyl-4-methyl-5-hydroxymethylimidazole.

Among these, 1-benzyl-2-methylimidazole, 1-benzyl-2-phenylimidazole and 2-ethyl-4-methylimidazole are preferable. These imidazole compounds exhibit particularly excellent compatibility to a resin component, and can, therefore, give a highly uniform cured product.

Examples of the inorganic filler (C) in the resin composition include, but not particularly limited to, silicates such as talc, calcined talc, calcined clay, uncalcined clay, mica and glass; oxides such as titanium oxide, alumina, silica and fused silica; carbonates such as calcium carbonate, magnesium carbonate and hydrotalcite; hydroxides such as aluminum hydroxide, magnesium hydroxide and calcium hydroxide; sulfates and sulfites such as barium sulfate, calcium sulfate and calcium sulfite; borates such as zinc borate, barium metaborate, aluminum borate, calcium borate and sodium borate; nitrides such as aluminum nitride, boron nitride, silicon nitride and carbon nitride; and titanate salts such as strontium titanate and barium titanate. These may be used alone or in combination of two or more. Thus, adequate strength can be obtained even when a laminated board becomes thinner (thickness: 0.4 mm or less). Furthermore, resistance to thermal expansion of a laminated board can be improved.

Among these, silica is preferable and spherical fused silica is particularly preferable in the light of its excellent resistance to thermal expansion. Silica may be of the crushed type or the spherical type, and spherical silica is preferable in the light of reducing a melt viscosity of a resin composition forming an insulating resin layer in a prepreg.

In preparing a prepreg, an average particle size of the inorganic filler (C) is, but not limited to, preferably 0.005 to 10 μm, more preferably 0.01 to 5 μm, and the filler is particularly preferably a spherical fused silica having an average particle size of 0.01 to 2 μm. Thus, filling performance of the inorganic filler is improved. If a particle size of the inorganic filler is less than 0.005 μm, a varnish becomes highly viscous that workability during preparing a prepreg may be adversely affected. In particular, a spherical fused silica having a size of 0.01 to 2 μm is sufficiently dispersible in the epoxy resin (A) to give a prepreg exhibiting good processability.

The average particle size can be determined by, for example, a particle size distribution analyzer (HORIBA, LTD., LA-500).

In terms of particle size distribution in the inorganic filler (C), an average particle size may be, but not limited to, monodisperse or polydisperse. Inorganic fillers having a monodisperse and/or polydisperse average particle size maybe used alone or in combination of two or more.

A content of the inorganic filler is, but not limited to, preferably 20 to 85% by weight, more preferably 30 to 80% by weight for preparing a prepreg, particularly preferably 35 to 70% by weight to the total amount of the resin composition. When the content is within 20 to 85% by weight, resistance to thermal expansion and anti-hygroscopicity can be particularly improved.

The cyanate resin (D) and/or the prepolymer thereof can reduce a linear expansion coefficient of a resin composition as described above. Furthermore, it can give, for example, a prepreg with excellent electric properties (a low dielectric constant and a low dielectric loss tangent) and mechanical strength.

Here, a cyanate resin and/or a prepolymer thereof can be prepared by, for example, reacting a cyanogen halide compound with phenols and, if necessary, converting the product to a prepolymer by an appropriate method such as heating. Specific examples may include bisphenol type cyanate resins such as novolac type cyanate resins, bisphenol-A type cyanate resins, bisphenol-E type cyanate resins and tetramethyl-bisphenol-F type cyanate resins. Among these, a novolac type cyanate resin is preferable. Thus, a crosslink density is so increased that heat resistance and flame retardancy of a resin composition and the like can be improved. It is because a novolac type cyanate resin forms a triazine ring after a curing reaction. It may be also because a novolac type cyanate resin tends to carbonize due to a higher proportion of the benzene ring in its structure. Furthermore, even when a prepreg has a thickness of 0.5 mm or less, a laminated board prepared by curing the prepreg can have excellent rigidity. Particularly, it exhibits excellent rigidity during heating and is thus highly reliable during mounting a semiconductor element.

The novolac type cyanate resin may, for example, have the structure represented by formula (3).

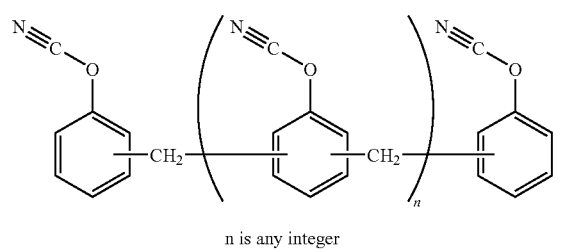

(3)

n is any integer

An average repeating unit number "n" in the novolac type cyanate resin of formula (3) is, but not limited to, preferably 1 to 10, particularly preferably 2 to 7. If an average repeating unit number "n" is less than the above lower limit, a novolac type cyanate resin may be insufficiently heat resistant. If an average repeating unit number "n" is more than the above upper limit, a melt viscosity may become so high that a moldability of a prepreg may be deteriorated.

A weight-average molecular weight of the cyanate resin is, but not limited to, preferably $5.0 \times 10^2$ to $4.5 \times 10^3$, particularly preferably $6.0 \times 10^2$ to $3.0 \times 10^3$. If a weight-average molecular weight is less than $5.0 \times 10^2$, a prepreg prepared may be tacky, so that when prepregs are in contact with each other, they may adhere to each other or resin transfer may occur. If a weight-average molecular weight is more than $4.5 \times 10^3$, the reaction become so fast that defective molding may occur particularly when the resin is used for a laminated board.

A weight-average molecular weight of, for example, the cyanate resin can be determined by, for example, a GPC (gel permeation chromatography, converted to polystyrene as a standard).

The cyanate resins can be, but not limited to, used alone, in combination of two or more having different weight-average molecular weights, or one or more of the above cyanate resins can be combined with their prepolymers.

A content of the cyanate resin and/or the prepolymer of the cyanate resin is, but not limited to, preferably 3 to 50% by weight, particularly 3 to 46% by weight, further preferably 10 to 40% by weight when a prepreg is prepared, to the total amount of the resin composition. If the content is less than 3% by weight, a molding such as a prepreg may not be obtained, and if the content is more than 50% by weight, a molding such as a prepreg may have lower strength.

It has been observed that when a different type epoxy resin is combined with a cyanate resin without the epoxy resin (A) being used, considerable streak irregularity occurs with 3% by weight or more of a cyanate resin and/or a prepolymer of the cyanate resin to the total amount of the resin composition.

Preferably, the resin composition further contains, in addition to the above (A) and (D), a thermosetting resin (substantially halogen-free). Examples of the thermosetting resin include bisphenol type epoxy resins such as bisphenol-A type epoxy resins, bisphenol-F type epoxy resins, bisphenol-S type epoxy resins, bisphenol-E type epoxy resins, bisphenol-M type epoxy resins, bisphenol-P type epoxy resins and bisphenol-Z type epoxy resins; novolac type epoxy resins such as phenol novolac type epoxy resins and cresol novolac epoxy resins; epoxy resins such as biphenyl type epoxy resins, biphenylaralkyl type epoxy resins, arylalkylene type epoxy resins, naphthalene type epoxy resins, anthracene type epoxy resins, phenoxy type epoxy resins, dicyclopentadiene type epoxy resins, norbornene type epoxy resins, adamantane type epoxy resins and fluorene type epoxy resins; triazine ring-containing resins such as urea resins and melamine resins; unsaturated polyester resins; bismaleimide resins; polyurethane resins; diallyl phthalate resins; silicone resin; and benzoxazine ring-containing resins.

These can be used alone or in combination of two or more.

The resin composition preferably contains, but not particularly limited to, a coupling agent. The coupling agent generally improves wettability of an interface between the thermosetting resin and the inorganic filler. Furthermore, it allows a thermosetting resin and the like and an inorganic filler to homogeneously fix to a fiber base material, so that heat resistance, particularly solder heat resistance after moisture absorption can be improved.

Specific examples of the coupling agent preferably include, but not particularly limited to, one or more selected from epoxy silane coupling agents, cationic silane coupling agents, aminosilane coupling agents, titanate coupling agents and silicone oil type coupling agents. Thus, high wettability of the inorganic filler with the interface can be obtained and heat resistance can be, therefore, further improved.

A content of the coupling agent is, but not limited to, preferably 0.05 to 3 parts by weight, particularly preferably 0.1 to 2 parts by weight to 100 parts by weight of the inorganic filler. With the content of less than 0.05 parts by weight, the inorganic filler is insufficiently covered, so that heat resistance may not be sufficiently improved, while the content of more than 3 parts by weight may adversely affect the reaction, leading to deterioration in, for example, bending strength.

The resin composition may further contain a component which can improve adhesiveness of the resin composition to a conductor layer. Examples may include such as phenoxy resins, polyvinyl alcohol resins and coupling agents which improve adhesiveness to a metal constituting a conductor layer. Among these, a phenoxy resin particularly preferably added in the light of good adhesiveness to a metal and having a less affect on a curing reaction rate. Examples of such a phenoxy resin include phenoxy resins having a bisphenol skeleton, phenoxy resins having a novolac skeleton, phenoxy resins having a naphthalene skeleton, and phenoxy resins having a biphenyl skeleton. Alternatively, a phenoxy resin having a structure containing a plurality of these skeletons can be used.

In addition, the resin composition may contain, if necessary, additives other than those described above, such as a pigment, a dye, an antifoaming agent, a leveling agent, an ultraviolet absorber, a foaming agent, an antioxidant, a flame retardant and an ion scavenger.

There will be described a prepreg.

A prepreg from the above epoxy resin composition is prepared by impregnating a base material with the resin composition. Thus, there can be provided a prepreg suitable for manufacturing a printed wiring board exhibiting excellent properties such as dielectric properties and mechanical and electric-connection reliability in hot and humid conditions.

Examples of the base material include, but not particularly limited to, glass fiber base materials such as glass fabrics and glass nonwoven fabrics; and organic fiber base materials including polyamide type resin fibers such as polyamide resin fibers, aromatic polyamide resin fibers and wholly aromatic polyamide resin fiber; polyester type resin fibers such as polyester resin fibers, aromatic polyester resin fibers and wholly aromatic polyester resin fibers; synthetic fiber base materials made of a woven or unwoven cloth containing a polyimide resin fiber, a fluororesin fiber or the like as a main component; and organic fiber base materials such as paper base materials made of a craft paper, a cotton linter paper, a mixed paper of a linter and a craft pulp, or the like as a main component. Among these, a glass fiber base material is preferable. Thus, a prepreg can have improved strength, a reduced water absorption and a lower thermal expansion coefficient.

Examples of a glass constituting the above glass fiber base material include, but not particularly limited to, an E-glass, a C-glass, an A-glass, a S-glass, a D-glass, a NE-glass, a T-glass and a H-glass. Among these, an E-glass, a T-glass and a S-glass are preferable. Thus, a glass fiber base material can be highly elastic and can also have a lower thermal expansion coefficient.

The prepreg may be prepared by, but not limited to, a method where a resin varnish is first prepared using the above epoxy resin composition and a base material is impregnated with the resin varnish.

Additional examples of a method for preparing a prepreg include application using a variety of coaters and spraying using a spray device. Among these, a preferable method is immersion of a base material in a resin varnish. Thus, impregnation properties of the resin composition to the can be improved. When the base material is impregnated with the resin varnish, a common impregnating application apparatus can be used.

It is desirable that a solvent used for the resin varnish can satisfactorily dissolve the resin component in the resin composition, but a poor solvent can be used as long as it does not adversely affect. Examples of a solvent exhibiting good dissolving properties include acetone, methyl ethyl ketone, methyl isobutyl ketone, cyclohexanone, cyclopentanone, tetrahydrofuran, dimethylformamide, dimethylacetamide, dimethyl sulfoxide, ethylene glycol, cellosolves and carbitols.

A solid content in the resin varnish is, but not particularly limited to, preferably 50 to 80% by weight, particularly preferably 60 to 78% by weight of the solid amount of the resin composition. Thus, impregnation properties of the resin varnish to the base material can be further improved. There are no particular restrictions to a predetermined temperature at which the base material is impregnated with the resin composition; for example, drying at 90 to 220° C. and the like can provide a prepreg.

Next, a laminated board will be described. It will be described with reference to FIG. 1.

A laminated board 2 of this embodiment can be prepared by laminating at least one or more of the prepregs (corresponding to symbol 1 in FIG. 1), on both sides of which a metal foil 21 is then laminated and the laminate is heated and pressed. The heating temperature is, but not limited to, preferably 120 to 230° C., particularly preferably 150 to 210° C. The pressure is, but not limited to, preferably 1 to 5 MPa, particularly preferably 2 to 4 MPa. Thus, there can be provided a laminated board 2 having excellent dielectric properties and excellent mechanical and electric connection reliability in hot and humid conditions.

Examples of the metal foil 21 include, but not particularly limited to, metal foils made of such as copper and a copper alloy, aluminum and an aluminum alloy, silver and a silver alloy, gold and a gold alloy, zinc and a zinc alloy, nickel and a nickel alloy, tin and a tin alloy, and iron and an iron alloy.

Figure 2:
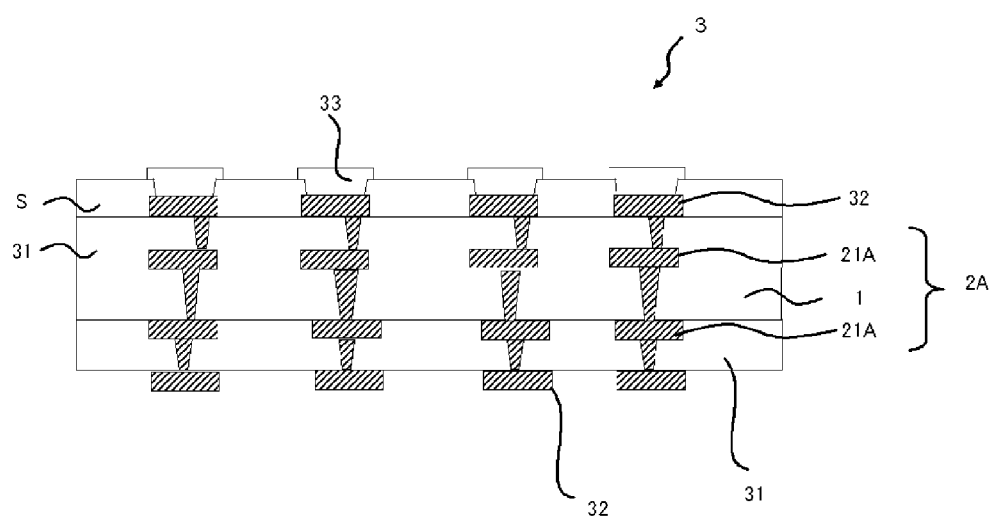
FIG. 2 shows a multilayer printed wiring board in accordance with the first embodiment of the present invention.

There will be described a multilayer printed wiring board 3 with reference to FIG. 2.

A two-side copper-clad laminated board 2 having copper foils (metal foil 21) on both upper and lower surfaces is prepared, a predetermined conductor circuit (inner circuit) 21A is formed on both sides by, for example, etching, and the conductor circuit 21A is subjected to roughening such as blackening to prepare an inner circuit board 2A.

Next, insulating resin sheets with a film or metal foil, or the above-mentioned prepregs are formed over the upper and the lower surfaces of the inner circuit board 2A, and the product is molded under heating and pressing.

Specifically, the insulating resin sheet with a film or metal foil, or the prepreg of this embodiment is laminated with the inner circuit board 2A, and the laminate is molded under heating and pressing in vacuo, using, for example, a vacuum pressing laminator. Then, the product can be cured by heating using a hot air dryer, to form an insulating layer 31 over the inner circuit board 2A.

There are no particular restrictions to the conditions of hot and press molding; as one example, the molding can be conducted at a temperature of 60 to 160° C. and a pressure of 0.2 to 3 MPa. There are no particular restrictions to the conditions of heat curing; as one example, the curing can be conducted at a temperature of 140 to 240° C. for a period of 30 to 120 min.

Alternatively, the insulating resin sheet with a film or metal foil, or the prepreg of this embodiment can be laminated on the inner circuit board 2A, and the laminate can be molded under heating and pressing by means of a flat hot press to form the insulating layer 31 over the inner circuit board 2A.

There are no particular restrictions to the conditions of hot and press molding; as one example, the molding can be conducted at a temperature of 140 to 240° C. and a pressure of 1 to 4 MPa.

The insulating layer surface of the substrate thus obtained can be roughened by an oxidizing agent such as a permanganate and a bichromate and then subjected to metal plating to form a new conductive circuit.

Subsequently, the insulating layer 31 is cured by heating. A curing temperature may be, but not limited to, within a range of 100° C. to 250° C. Preferably, it is cured at 150° C. to 200° C.

Next, an aperture is formed in the insulating layer 31 using a carbon dioxide laser equipment and an outer circuit 32 is formed over the surface of the insulating layer by electrolytic copper plating, to electrically connect the outer circuit 32 to the inner circuit 21A. In the outer circuit 32, there is formed a connecting electrode 33 for mounting a semiconductor element.

Then, a solder resist S is formed in the outermost layer, the connecting electrode 33 is exposed by exposure and development for mounting a semiconductor element, nickel-gold plating is performed and the product is cut into a predetermined size to give a multilayer printed wiring board 3.

Figure 3:
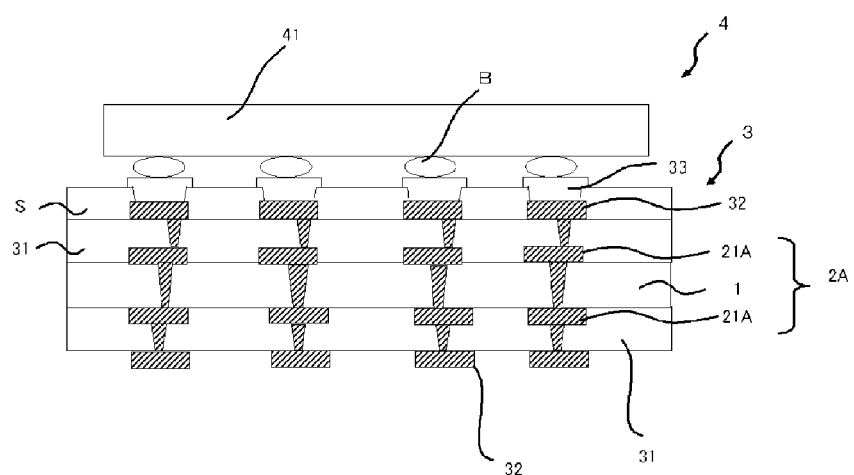
FIG. 3 shows a semiconductor device.

Next, there will be described a semiconductor device 4 with reference to FIG. 3.

The semiconductor device 4 can be manufactured by mounting a semiconductor element 41 on the multilayer printed wiring board 3 prepared as described above. There are no particular restrictions to a method for mounting or sealing the semiconductor element 41. For example, in terms of the semiconductor element 41 and the multilayer printed wiring board 3, the connecting electrode 33 over the multilayer printed wiring board 3 is aligned with a solder bump B in the semiconductor element 41 using, for example, a flip-chip bonder. Then, the solder bump B is heated to a temperature higher than or equal to its melting point using a heating apparatus such as an IR reflow oven and a hot plate, for fusion bonding of the multilayer printed wiring board 3 and the solder bump B. Then, a space between the multilayer printed wiring board 3 and the semiconductor element 41 is filled with a liquid sealant resin (not shown) and the resin can be cured to provide a semiconductor device 4.

Second Embodiment

There will be described an insulating resin sheet, a multilayer printed wiring board, a process for manufacturing a multilayer printed wiring board, and a semiconductor device according to the present invention.

First, there will be described an insulating resin sheet.

Figure 4:
FIG. 4 shows an insulating resin sheet in accordance with the second embodiment of the present invention.

An insulating resin sheet 5 can be prepared by forming an insulating resin layer 51 containing, as essential components, an epoxy resin having a structure represented by general formula (1) (A) (hereinafter, referred to as an epoxy resin (A)), a curing agent (B), an inorganic filler (C) and a cyanate resin and/or a prepolymer of the cyanate resin (D) on a carrier film 52A or metal foil 52B as shown in FIG. 4.

The use of the epoxy resin (A) allows for improvement in compatibility between the epoxy resin (A) and the cyanate resin (D), for improvement in dispersibility of the inorganic filler (C) in the resin component, and for preventing separation of the resin component from the inorganic filler (C). Thus, the cyanate resin and the inorganic filler (C) can be used not only to reduce a linear expansion coefficient but also to prevent streak irregularity and to give a flat sheet surface during an insulating resin sheet is prepared.

Thus, in terms of the insulating resin sheet, the surface of an insulating resin layer of a laminate of the insulating resin sheets can be uniformly roughened even when fine wiring processing is required. In addition, moldability is improved; for example, adhesiveness of the insulating resin layer to a conductor circuit is improved.

Furthermore, the use of the epoxy resin (A) allows the composition to have a lower melt viscosity even when it contains the inorganic filler (C). Thus, processability can be improved when a laminated board or the like is manufactured.

When a melt viscosity is lowered using an epoxy resin having a different structure instead of the epoxy resin (A), the insulating resin sheet more frequently has streak irregularity.

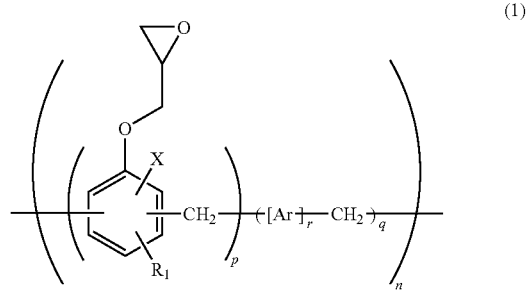

(1)

wherein Ar represents a fused aromatic hydrocarbon group; r is an integer of 1 or more; X represents a hydrogen or an epoxy group (glycidyl ether group); $R_1$ represents one selected from the group consisting of a hydrogen, a methyl group, an ethyl group, a propyl group, a butyl group, a phenyl group and a benzyl group; n is an integer of 1 or more; p, q is an integer of 1 or more; p's and q's in respective repeating units may be the same as or different from one another.

The fused aromatic hydrocarbon group [Ar] in the epoxy resin (A) used for the insulating resin sheet 5 preferably has one of the structures represented by formulas (Ar1) to (Ar4). Formula (Ar1) is more preferable and formula (A1) in which $R_2$ is a methyl group is particularly preferable. Such a structure may lead to improvement in an appearance and embedding properties during press molding and improvement in moldability.

(2)

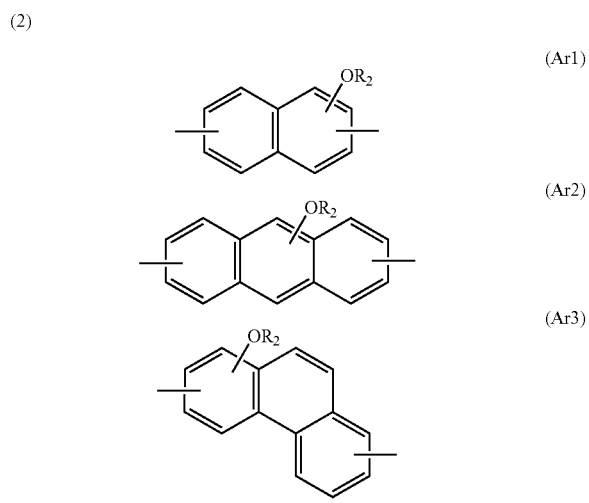

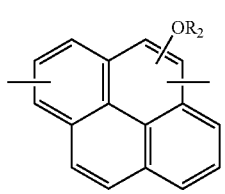

(Ar4)

wherein $R_2$ represents one selected from the group consisting of a hydrogen atom, a methyl group, an ethyl group, a propyl group, a butyl group, a phenyl group and a benzyl group.

A content of the copolymer epoxy resin (A) used for the insulating resin sheet 5 is preferably, but not limited to, 1 to 20% by weight of the insulating resin layer, particularly preferably 5% by weight or less for preparing the insulating resin sheet 5. A content of less than 1% by weight may lead to insufficient prevention of separation of a filler component from the resin component while a content of more than 20% by weight may lead to deterioration in flame resistance.

The insulating resin layer 51 in the insulating resin sheet 5 may contain, in addition to the epoxy resin (A), an additional epoxy resin. Examples of the additional epoxy resin include, but not particularly limited to, novolac type epoxy resins such as phenol novolac type epoxy resins and cresol novolac epoxy resins; and epoxy resins such as biphenyl type epoxy resins, biphenylaralkyl type epoxy resins, arylalkylene type epoxy resins, naphthalene type epoxy resins, anthracene type epoxy resins, phenoxy type epoxy resins, dicyclopentadiene type epoxy resins, norbornene type epoxy resins, adamantane type epoxy resins and fluorene type epoxy resins. Among these, particularly preferred are novolac type epoxy resins such as phenol novolac type epoxy resins and cresol novolac epoxy resins, biphenyl type epoxy resins, biphenylaralkyl type epoxy resins and arylalkylene type epoxy resins. Thus, heat resistance and flame retardancy can be improved.

Examples of the curing agent (B) used for the insulating resin sheet 5 include, but not particularly limited to, imidazole compounds; organometallic salts such as zinc naphthenate, cobalt naphthenate, tin octylate, cobalt octylate, bis(acetylacetonate) cobalt (II) and tris(acetylacetonate) cobalt (III); tertiary amines such as triethylamine, tributylamine and diazabicyclo[2,2,2]octane; phenol compounds such as phenol, bisphenol-A and nonylphenol; organic acids such as acetic acid, benzoic acid, salicylic acid and para-toluenesulfonic acid; and a mixture of these. Including their derivatives, these may be used alone or in combination of two or more as a hardening accelerator.

Among these hardening accelerators, imidazole compounds are particularly preferable. Thus, solder heat resistance after moisture absorption can be improved. And it is desirable, but not particularly limited to, that the above imidazole compound is compatible with the epoxy resin (A) and the additional epoxy resin.

The term, "compatible" as used herein means that when the imidazole compound is mixed with the epoxy resin (A) and the additional epoxy resin in an organic solvent, these are dissolved substantially at the molecular level or dispersed nearly in such a state.

The imidazole compound contained in the resin composition used for the insulating resin layer 51 in the insulating resin sheet 5 can effectively accelerate the reaction of the epoxy resin (A) and the additional epoxy resin, and furthermore, even when the content of the imidazole compound is reduced, equivalent properties can be obtained.

Furthermore, a resin composition containing such an imidazole compound can be highly uniformly cured from a fine matrix unit between the resin components. Thus, the insulating resin layer 51 formed in a multilayer printed wiring board can exhibit improved insulating performance and solder heat resistance.

Examples of the imidazole compound include 1-benzyl-2-methylimidazole, 1-benzyl-2-phenylimidazole, 2-phenyl-4-methylimidazole, 2-ethyl-4-methylimidazole, 2,4-diamino-6-[2'-methylimidazolyl-(1')]-ethyl-s-triazine, 2,4-diamino-6-(2'-undecylimidazolyl)-ethyl-s-triazine, 2,4-diamino-6-[2'-ethyl-4-methylimidazolyl-(1')]-ethyl-s-triazine, 2-phenyl-4,5-dihydroxymethylimidazole, 2-phenyl-4-methyl-5-hydroxymethylimidazole and the like.

Among these, 1-benzyl-2-methylimidazole, 1-benzyl-2-phenylimidazole and 2-ethyl-4-methylimidazole are preferable. These imidazole compounds are so compatible that they can give a highly uniform cured product and form a fine and uniformly roughened plane in the surface of the insulating resin layer, allowing a fine conductor circuit to be readily formed and a multilayer printed wiring board to be highly heat-resistant.

Examples of the inorganic filler (C) include, but not particularly limited to, silicates such as talc, calcined talc, calcined clay, uncalcined clay, mica and glass; oxides such as titanium oxide, alumina, silica and fused silica; carbonates such as calcium carbonate, magnesium carbonate and hydrotalcite; hydroxides such as aluminum hydroxide, magnesium hydroxide and calcium hydroxide; sulfates and sulfites such as barium sulfate, calcium sulfate and calcium sulfite; borates such as zinc borate, barium metaborate, aluminum borate, calcium borate and sodium borate; nitrides such as aluminum nitride, boron nitride, silicon nitride and carbon nitride; and titanate salts such as strontium titanate and barium titanate. These may be used alone or in combination of two or more. Among these, silica is preferable and fused silica is preferable in the light of its excellent resistance to thermal expansion. Silica may be of the crushed type or the spherical type, and spherical silica is preferable in the light of reducing a melt viscosity of a resin composition forming an insulating resin layer.

A particle size of the inorganic filler (C) is preferably 1.2 μm or less, more preferably 0.01 to 10 μm, particularly preferably 0.2 to 1.0 μm as an average particle size for preparing the insulating resin sheet 5. An average particle size of less than 0.01 μm may lead to increase in a viscosity of a varnish prepared from the resin composition, while the particle size of more than 1.2 μm may cause settling of the inorganic filler in a varnish prepared from the resin composition, and both cases may lead to deteriorated workability.

A content of the inorganic filler (C) is preferably 20 to 85% by weight of the insulating resin layer, and furthermore, is preferably 30 to 65% by weight for preparing the insulating resin sheet 5. If the content of the inorganic filler is less than the lower limit, a product may not be sufficiently elastic or resistant to thermal expansion. If the content is more than the upper limit, flowability may be so reduced that moldability may be deteriorated when a multilayer printed wiring board is prepared using this insulating resin sheet.

A resin composition used for the insulating resin sheet 5 preferably contains a phenoxy resin. Examples of the phenoxy resin include, but not particularly limited to, phenoxy resins having a bisphenol skeleton such as phenoxy resins having a bisphenol-A skeleton, phenoxy resins having a bisphenol-F skeleton, phenoxy resins having a bisphenol-S skeleton, phenoxy resins having a bisphenol-M skeleton, phenoxy resins having a bisphenol-P skeleton and phenoxy resins having a bisphenol-Z skeleton; phenoxy resins having a novolac skeleton; phenoxy resins having an anthracene skeleton; phenoxy resins having a fluorene skeleton; phenoxy resins having a dicyclopentadiene skeleton; phenoxy resins having a norbornene skeleton; phenoxy resins having a naphthalene skeleton; phenoxy resins having a biphenyl skeleton; and phenoxy resins having an adamantane skeleton.

Alternatively, as a phenoxy resin, a structure having a plurality of these skeletons may be used, or a phenoxy resin containing the skeletons in a different ratio. Furthermore, a plurality of phenoxy resins having a different skeleton may be used, a plurality of phenoxy resins having a different weight-average molecular weight may be used, or prepolymers of them may be combined.

Among these, a phenoxy resin having a biphenyl skeleton and a bisphenol-S skeleton is preferable. Thus, rigidity of the biphenyl skeleton can contribute to raising a glass transition temperature and the bisphenol-S skeleton can improve adhesiveness of a plated metal when a multilayer printed wiring board is prepared.

A phenoxy resin having a bisphenol-A skeleton and a bisphenol-F skeleton is also preferable. Thus, adhesiveness to the inner circuit board can be improved when a multilayer printed wiring board is prepared. The phenoxy resin having a biphenyl skeleton and a bisphenol-S skeleton can be used in combination with a phenoxy resin having a bisphenol-A skeleton and a bisphenol-F skeleton.

A content of the phenoxy resin used for the insulating resin sheet 5 is, but not limited to, preferably 3 to 25% by weight, more preferably 5 to 20% by weight of the insulating resin layer 51. If the content of the phenoxy resin is less than 3% by weight, the phenoxy resin may not be sufficiently effective in improving film-forming performance of the insulating resin sheet, and if the content of the phenoxy resin is more than 25% by weight, a varnish viscosity may be so increased that its solubility in another resin may be deteriorated.

The insulating resin layer 51 in the insulating resin sheet 5 contains a cyanate resin and/or a prepolymer of the cyanate resin (D).

The cyanate resin and/or its prepolymer resin can be prepared by, but not limited to, reacting a cyanogen halide compound with phenols and converting the product to a prepolymer, if necessary, by an appropriate method such as heating. Alternatively, a commercially available product prepared as described above can be used.

The use of the cyanate resin and/or its prepolymer can improve an elastic modulus of the insulating resin layer in the insulating resin sheet. Furthermore, a cyanate resin (particularly, a novolac type cyanate resin) has a rigid chemical structure, so that it can be highly heat resistant, can exhibit less reduction in an elastic modulus at a temperature higher than or equal to a glass transition temperature, and can maintain a higher electric modulus even at an elevated temperature. Furthermore, they do not generate a highly polar functional group such as a hydroxy group by a curing reaction and can thus exhibit excellent dielectric properties.

Among the cyanate resins and/or their prepolymers, a novolac type cyanate resin represented by general formula (3) is preferable. Thus, in addition to the above effects, a glass transition temperature of the insulating resin layer in the insulating resin sheet can be further increased and flame retardancy of the insulating resin layer after curing can be further improved.

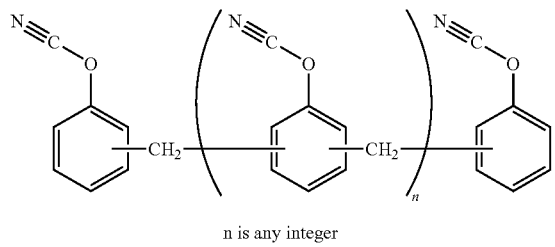

(3)

n is any integer

An average repeating unit number "n" in the novolac type cyanate resin of formula (3) is, but not limited to, preferably 1 to 10, particularly preferably 2 to 7. If an average repeating unit number "n" is less than the above lower limit, a novolac type cyanate resin may be insufficiently heat resistant. If an average repeating unit number "n" is more than the above upper limit, a melt viscosity may become so high that a prepreg cannot have adequate moldability.

A weight-average molecular weight of the cyanate resin is, but not limited to, preferably $5.0 \times 10^2$ to $4.5 \times 10^3$, particularly preferably $6.0 \times 10^2$ to $3.0 \times 10^3$. If a weight-average molecular weight is less than $5.0 \times 10^2$, a prepreg prepared may be tacky, so that when prepregs are in contact with each other, they may adhere to each other or resin transfer may occur. If a weight-average molecular weight is more than $4.5 \times 10^3$, the reaction become so fast that defective molding may occur particularly when the resin is used for a laminated board.

A weight-average molecular weight of, for example, the cyanate resin can be determined by, for example, a GPC (gel permeation chromatography, converted to polystyrene as a standard).

A content of the cyanate resin and/or its prepolymer is, but not limited to, preferably 3 to 50% by weight, particularly 4 to 46% by weight and, when the insulating resin sheet 5 is prepared, 5% by weight or more, further preferably 10 to 40% by weight.

Thus, the surface of the inner circuit board in which a circuit pattern is formed can be firmly bonded to the insulating resin layer 51 in the insulating resin sheet 5.

The resin composition for the insulating resin sheet 5 can optionally contain various additives such as a leveling agent, an antifoam, an antioxidant, a pigment, a dye, an antifoam, a flame retardant, an ultraviolet absorber, an ion scavenger, an inert diluent, a reactive diluent, a thixotropic agent and a thickener for improving a variety of properties such as compatibility, stability and workability of the resin.

About the insulating resin sheet 5, a resin varnish is prepared by dissolving, mixing and stirring the resin composition for forming the insulating resin layer 51 in an organic solvent such as acetone, methyl ethyl ketone, methyl isobutyl ketone, toluene, ethyl acetate, cyclohexanone, heptane, cyclohexanecyclohexanone, tetrahydrofuran, dimethylformamide, dimethylacetamide, dimethyl sulfoxide, ethylene glycol, cellosolves, carbitols and anisole, using any of various mixers such as an ultrasonic dispersion type, a high-pressure impact dispersion type, a high-speed rotating dispersion type, a bead mill type, a high speed shearing dispersion type and a rotation/revolution type mixers.

A content of the resin composition in the resin varnish is, but not limited to, preferably 45 to 85% by weight, particularly preferably 55 to 75% by weight.

Next, a film 52A or a metal foil 52B is coated with the resin varnish using any of various coaters and then the product is dried. Alternatively, a film or metal foil is spray-coated with the resin varnish using a spray device and then the product is dried. By such a method, an insulating resin sheet 5 with a film or metal foil can be prepared.

Examples of the coater may include, but not particularly limited to, a roll coater, a bar coater, a knife coater, a gravure coater, a die coater, a comma coater, a curtain coater and the like. Among these, preferred is a method using a die coater, a knife coater or a comma coater. Thus, the insulating resin sheet 5 with a uniform thickness of the insulating resin layer 51 without voids can be efficiently prepared.

The insulating resin sheet 5 is prepared by forming the insulating resin layer 51 made of the resin composition over the carrier film 52A or the metal foil 52B. The carrier film 52A is preferably selected from those which can be easily handled because the insulating resin layer 51 is formed over the carrier film 52A. Furthermore, since the insulating resin layer 51 in the insulating resin sheet 5 is deposited on the surface of the inner circuit board and the carrier film 52A is removed, it is preferable that the resin layer is easily peelable after laminating it on the inner circuit board. The carrier film 52A is, therefore, preferably selected from heat-resistant thermoplastic resin films, including polyester resins such as polyethylene terephthalates and polybutylene terephthalates, fluororesins and polyimide resins. Among these carrier films 52A, a film made of a polyester is the most preferable. Thus, it can be easily peeled from the insulating resin layer with an appropriate force.

A thickness of the carrier film 52A is, but not limited to, preferably 1 to 100 μm, particularly preferably 3 to 50 μm. When a thickness of the carrier film 52A is within the above range, it can be easily handled and the surface of the insulating resin layer is significantly flat.

The metal foil 52B may be peeled after laminating the insulating resin sheet 5 on the inner circuit board as described for the carrier film 52A, or alternatively, the metal foil 52B may be etched and used as a conductor circuit. Examples of metal foil 52B may include, but not particularly limited to, but not particularly limited to, a metal foil made of such as a copper and/or a copper alloy, an aluminum and/or an aluminum alloy, an iron and/or an iron alloy, a silver and/or a silver alloy, a gold and a gold alloy, a zinc and a zinc alloy, a nickel and a nickel alloy, or a tin and a tin alloy.

A thickness of the metal foil 52B is, but not limited to, preferably 0.1 μm or more and 70 μm or less. It is more preferably 1 μm or more and 35 μm or less, further preferably 1.5 μm or more and 18 μm or less. If the thickness of the metal foil 52B is less than the lower limit, the metal foil 52B may be damaged to form a pinhole which, when the metal foil 52B is etched for being used as a conductor circuit, may cause problems such as large plating variation during forming a circuit pattern, circuit disconnection and penetration of a chemical such as an etchant and a desmear solution, and if the thickness is more than the upper limit, variation in a thickness of the metal foil 52B may be increased and/or variation in a surface roughness in the roughened surface of the metal foil 52B may be increased.

The metal foil 52B may be an ultrathin metal foil with a carrier foil. An ultrathin metal foil with a carrier foil is a metal foil prepared by laminating a removable carrier foil with an ultrathin metal foil. The use of an ultrathin metal foil with a carrier foil allows for forming ultrathin metal foil layers in both sides of the insulating resin layer, so that, for example, when a circuit is formed by a semiadditive method, electrolytic plating can be, instead of electroless plating, conducted directly using the ultrathin metal foil as a feeding layer and thus, after forming the circuit, the ultrathin copper foil can be flash-etched. The use of the ultrathin metal foil with a carrier foil can prevent deterioration in handling properties of the ultrathin metal foil and breaking or tear in the ultrathin metal foil during a press process even when the ultrathin metal foil has a thickness of 10 μm or less. A thickness of the ultrathin metal foil is preferably 0.1 μm or more and 10 μm or less. It is more preferably 0.5 μm or more and 5 μm or less, further preferably 1 μm or more and 3 μm or less. If the thickness of the ultrathin metal foil is less than the lower limit, there may be caused problems such as damage in the ultrathin metal foil after peeling the carrier foil, generation of a pinhole in the ultrathin metal foil, large variation in plating during forming a circuit pattern due to generation of a pinhole, disconnection of a circuit wiring and penetration of a chemical such as an etchant and a desmear solution, and if the thickness is more than the upper limit, variation in a thickness of the ultrathin metal foil may be increased and/or variation in a surface roughness in the roughened surface of the ultrathin metal foil may be increased.

Generally, in the ultrathin metal foil with a carrier foil, the carrier foil is peeled before forming a circuit pattern in the laminated board after press molding.

There will be described a process for manufacturing a multilayer printed wiring board. This embodiment will be described with reference to FIG. 2. In this embodiment, an insulating layer indicated by the symbol 31 corresponds to the insulating resin layer 51 in the insulating resin sheet 5.

The inner circuit board 2A may be as described in the first embodiment or maybe made of a material different from that in the first embodiment.

In a process for manufacturing a multilayer printed wiring board using the insulating resin sheet 5 described above, first, a circuit pattern is formed on a core substrate (for example, a FR-4 double-sided copper foil) to prepare an inner circuit board 2A, which is then drilled to form an opening and the opening is plated by electroless plating for conduction between both sides of the inner circuit board. Then, the copper foil is etched to form an inner circuit 21A.

Suitably, the circuit 21A in the inner circuit board 2A may be preliminarily roughened by, for example, blackening. The opening can be filled with an appropriate material such as a conductor paste and a resin paste.

The inner circuit 21A may be made of any material as long as it is compatible to the manufacturing process, and the material is preferably removable by, for example, etching or peeling during forming an inner circuit and in the above etching, preferably chemical-resistant to an etchant used. Examples of such a material for an inner circuit include a copper foil, a copper plate, a copper alloy plate, a 42 alloy and nickel. In particular, a copper foil, a copper plate and a copper alloy plate are the most preferable as an inner circuit because they may be an electrolytic-plated or rolled product and products having a different thickness can be easily available.

Next, there will be described a process for manufacturing a multilayer printed wiring board using the above-mentioned insulating resin sheet 5 in which the insulating resin layer 51 is formed over the carrier film 52A.

First, on the inner circuit 21A is laminated by the insulating resin layer 51 in the insulating resin sheet 5 such that the circuit is covered by the resin layer (such that the insulating resin layer 51 is disposed in the side of the inner circuit 21A and the inner circuit 21A abuts on the insulating resin layer 51). The insulating resin sheet 5 can be preferably laminated by, but not particularly limited to, a vacuum press, an ambient-pressure laminator or a laminator conducting hot pressing in vacuo, more preferably by a laminator conducting heating hot pressing in vacuo. Thus, a space between circuits can be filled with an insulating resin layer without a void even for a microwiring circuit.

Next, the insulating resin layer 51 thus formed is cured by heating. A curing temperature is, but not limited to, preferably within the range of 100° C. to 250° C. It is particularly preferably 150° C. to 200° C. The layer may be semi-cured for facilitating subsequent laser irradiation and removal of a residual resin. Alternatively, a first insulating resin layer 51 is partially cured (semi-cured) at a temperature lower than a common heating temperature and over the insulating resin layer 51, one or a plurality of insulating resin layers are further formed, and the semi-cured insulating resin layer is again cured by heating to a practically acceptable extent, so that adhesiveness between the insulating resin layers and between the insulating resin layer and the circuit can be improved. A temperature during the semi-curing is preferably 80° C. to 200° C., more preferably 100° C. to 180° C. When a via is formed in the insulating resin layer by laser irradiation, the film 52A may be peeled, without limitation, before or after forming the via. The film 52A can be peeled, without problems, after forming the insulating resin layer 51, before curing by heating or after curing by heating.

Next, the insulating resin layer 51 is irradiated with a laser to form a via. Examples of a laser which can be used include an excimer laser, an UV laser and a carbon dioxide laser. By the above process for forming an opening by a laser, a fine via can be easily formed whether the material of the insulating resin layer 51 is photosensitive or nonphotosensitive. Therefore, the process is particularly preferable when a fine opening must be formed in the insulating resin layer.

Here, a residual resin and the like after laser irradiation is preferably removed by, for example, an oxidizing agent such as a permanganate and a bichromate. Furthermore, a flat surface of the insulating resin layer 51 can be simultaneously roughened, to improve adhesiveness of a conductive wiring circuit formed by the subsequent metal plating. The insulating resin layer 51 may have uniformly a fine asperity form in the roughening process. Furthermore, since the surface of the insulating resin layer 51 is considerably flat, a fine wiring circuit can be precisely formed.

Then, an outer circuit 32 is formed. The outer circuit 32 can be, for example, formed by, but not limited to, a well-known semiadditive method. Next, a conductor post is formed. The conductor post can be, for example, by well-known electrolytic plating. For example, copper electrolytic plating can be conducted for copper filling, using the outer circuit 32 as a lead for electrolytic plating, to form a copper post. The procedure can be repeated to form multiple layers. When the insulating resin layer is semi-cured in the previous step, it must be sometimes post-cured.

Subsequently, a solder resist S is formed. The solder resist S can be, for example, formed by, but not limited to, laminating a dry-film type solder resist S which is then exposed and developed, or by printing a liquid resist which is then exposed and developed. An electrode for connection can be appropriately coated by a metal film such as a gold plating, a nickel plating and a solder plating films. Such a process can provide a multilayer printed wiring board.

There will be described a process for manufacturing a multilayer printed wiring board 3 using an insulating resin sheet 5 in which an insulating resin layer 51 is formed over a metal foil 52B. The insulating resin sheet 5 having the metal foil 52B is laminated such that the insulating resin layer 51 covers the surface of the inner circuit 21A in the inner circuit board 2A. As described for lamination of the insulating resin sheet in the carrier film, the insulating resin sheet 5 with a metal foil can be laminated preferably by, but not limited to, a vacuum press, an ambient-pressure laminator or a laminator conducting heating and pressurizing in vacuo, more preferably by a laminator conducting heating and pressurizing in vacuo. Thus, the inner circuit board 2A in which a fine wiring circuit is formed can be filled with the insulating resin layer 51 without voids.

Here, when a via is formed in the insulating resin layer 51, a via can be formed by, but not limited to, etching a part of a metal foil in which a via is to be formed and irradiated the etched part with a laser; for example, conformal mask technique. The residual resin after laser irradiation is removed by an oxidizing agent such as a permanganate and a bichromate. Then, metal plating is conducted for forming connection between the insulating resin layers and etching is conducted to form an outer circuit (outer circuit pattern) 32. In addition, a metal post is preliminarily formed in an inner circuit board 2A and an insulating resin sheet 5 with a metal foil can be laminated on the post to form a via in the insulating resin layer 51. When further multilayering is required after forming the outer circuit pattern 32, an insulating resin sheet is laminated and the above process is repeated, and when the outer circuit formed becomes the outermost layer, a solder resist S can be formed as described above, to provide a multilayer printed wiring board 3.

Next, there will be described a semiconductor device 4 with reference to FIG. 3.

A semiconductor device 4 can be prepared by mounting a semiconductor element 41 having a solder bump B on the multilayer printed wiring board 3 obtained as described above. The solder bump B is preferably made of an alloy containing, for example, a tin, a lead, a silver, a copper and/or a bismuth. The semiconductor element 41 can be connected to the multilayer printed wiring board 3 by aligning a connecting electrode 33 on the substrate to the solder bump B in the semiconductor element 41 using, for example, a flip chip bonder. Then, the solder bump B is heated to a temperature higher than or equal to its melting point using a heating apparatus such as an IR reflow device and a hot plate for fusion joining of the multilayer printed wiring board 3 with solder bump B to form a connection. Here, for improving connection reliability, a metal layer with a relatively lower melting point such as a solder paste may be preliminarily formed in the connecting electrode 33 on the multilayer printed wiring board 3. Before the bonding process, a flux may be applied to the solder bump B and/or the surface layer of the connecting electrode 33 on the multilayer printed wiring board 3, to improve connectivity between the semiconductor element 41 and the multilayer printed wiring board 3.

The present invention is not limited to the embodiments described above, but variations and modifications are within the scope of the present invention as long as the objectives of this invention can be achieved.

There will be described examples of the present invention.

EXAMPLES

The present invention will be described by, but not limited to, Examples and Comparative Examples.

Example 1

(1) Preparation of a Resin Varnish

In methyl ethyl ketone were dissolved and dispersed 13.9 parts by weight of a methoxynaphthalene dimethylene type epoxy resin (Dainippon Ink And Chemicals, Incorporated, EXA-7320) as an epoxy resin (A), 11.0 parts by weight of a biphenyl dimethylene type phenol resin (Nippon Kayaku Co., Ltd., GPH-103) as a curing agent (B) and 24.8 parts by weight of a novolac type cyanate resin (D) (Lonza Japan Ltd., PRIMASET PT-30). Then, were added 50.0 parts by weight of spherical fused silica (ADMATECHS CO., LTD., "SO-25R", average particle size: 0.5 μm) as an inorganic filler (C) and 0.3 parts by weight of a coupling agent (Nippon Unicar Co., Ltd., A187), and the mixture was stirred using a high-speed stirrer for 10 min, to prepare a resin varnish having a solid content of 50% by weight.

(2) Preparation of a Prepreg

A glass fabric (thickness: 94 μm, Nitto Boseki Co., Ltd., WEA-2116) was impregnated with the above resin varnish, dried in an oven at 150° C. for 2 min, to prepare a prepreg having a solid varnish content of about 50% by weight.

(3) Preparation of a Laminated Board

Two prepregs described above were laminated and copper foils with a thickness of 18 μm were attached on both sides, and the laminate was hot/pressure-molded at a pressure of 4 MPa and a temperature of 200° C. for 2 hours, to form a laminated board with a thickness of 0.2 mm.

(4) Preparation of a Multilayer Printed Wiring Board A

Both sides of the double-sided copper-clad laminated board were etched to form circuits and the board was used as an inner circuit board. The prepregs obtained above were laminated on the front and the back sides of the inner circuit board, and the resulting laminate was subjected to hot/pressure molding in vacuo at a temperature of 100° C. and a pressure of 1 MPa using a vacuum pressing laminator. The product was cured by heating in a hot air dryer at 170° C. for 60 min to prepare a multilayer printed wiring board A for moldability evaluation described below.

(5) Preparation of a Multilayer Printed Wiring Board B

In the insulating layer in the multilayer printed wiring board, an opening was formed using a carbon dioxide laser apparatus and an outer circuit was formed in the insulating layer by electrolytic copper plating for electric connection between the outer circuit and the inner circuit. In the outer circuit was formed a connecting electrode for mounting a semiconductor element.

Then, a solder resist (Taiyo Ink Mfg. Co., Ltd., PSR4000/AUS308) was formed over the outermost layer, and was exposed and developed to expose the connecting electrode for mounting a semiconductor element, and the board was plated with nickel-gold and cut into a size of 50 mm×50 mm to prepare a multilayer printed wiring board B.

Example 2

A prepreg, a laminated board and multilayer printed wiring boards were prepared as described in Example 1 except that a resin varnish was prepared as described below.

In methyl ethyl ketone were dissolved and dispersed 14.0 parts by weight of a methoxynaphthalene dimethylene type epoxy resin (Dainippon Ink And Chemicals, Incorporated, EXA-7320) as an epoxy resin (A), 0.1 parts by weight of an imidazole compound (Shikoku Chemicals Corporation, "2-phenyl-4-methylimidazole") as a curing agent (B), 17.4 parts by weight of a novolac type cyanate resin (D) (Lonza Japan Ltd., PRIMASET PT-30) and 3.5 parts by weight of a phenoxy resin having a terminal epoxy group which was a copolymer of a bisphenol-A type epoxy resin and a bisphenol-F type epoxy resin (Japan Epoxy Resins Co., Ltd., "Epikote 4275", weight-average molecular weight: $6.0 \times 10^4$) as a phenoxy resin. Then, were added 64.7 parts by weight of spherical fused silica (ADMATECHS CO., LTD., "SO-25R", average particle size: 0.5 μm) as an inorganic filler and 0.3 parts by weight of a coupling agent (Nippon Unicar Co., Ltd., A187) and the mixture was stirred for 10 min using a high-speed stirrer to prepare a resin varnish having a solid content of 50% by weight.

Example 3

A prepreg, a laminated board and multilayer printed wiring boards were prepared as described in Example 1 except that a resin varnish was prepared as described below.

In methyl ethyl ketone were dissolved and dispersed 4.0 parts by weight of a methoxynaphthalene dimethylene type epoxy resin (Dainippon Ink And Chemicals, Incorporated, EXA-7320) as an epoxy resin (A), 0.1 parts by weight of an imidazole compound (Shikoku Chemicals Corporation, "2-phenyl-4-methylimidazole") as a curing agent (B), 27.4 parts by weight of a novolac type cyanate resin (D) (Lonza Japan Ltd., PRIMASET PT-30) and 3.5 parts by weight of a phenoxy resin having a terminal epoxy group which was a copolymer of a bisphenol-A type epoxy resin and a bisphenol-F type epoxy resin (Japan Epoxy Resins Co., Ltd., "Epikote 4275", weight-average molecular weight: $6.0 \times 10^4$) as a phenoxy resin. Then, were added 64.7 parts by weight of spherical fused silica (ADMATECHS CO., LTD., "SO-25R", average particle size: 0.5 μm) as an inorganic filler and 0.3 parts by weight of a coupling agent (Nippon Unicar Co., Ltd., A187) and the mixture was stirred for 10 min using a high-speed stirrer to prepare a resin varnish having a solid content of 50% by weight.

Example 4

A prepreg, a laminated board and multilayer printed wiring boards were prepared as described in Example 1 except that a resin varnish was prepared as described below.

In methyl ethyl ketone were dissolved and dispersed 42.0 parts by weight of a methoxynaphthalene dimethylene type epoxy resin (Dainippon Ink And Chemicals, Incorporated, EXA-7320) as an epoxy resin (A), 0.1 parts by weight of an imidazole compound (Shikoku Chemicals Corporation, "2-phenyl-4-methylimidazole") as a curing agent (B), 12.9 parts by weight of a novolac type cyanate resin (D) (Lonza Japan Ltd., PRIMASET PT-30) and 5.0 parts by weight of a phenoxy resin having a terminal epoxy group which was a copolymer of a bisphenol-A type epoxy resin and a bisphenol-F type epoxy resin (Japan Epoxy Resins Co., Ltd., "Epikote 4275", weight-average molecular weight: $6.0 \times 10^4$) as a phenoxy resin. Then, were added 39.8 parts by weight of spherical fused silica (ADMATECHS CO., LTD., "SO-25R", average particle size: 0.5 μm) as an inorganic filler (C) and 0.2 parts by weight of a coupling agent (Nippon Unicar Co., Ltd., A187) and the mixture was stirred for 10 min using a high-speed stirrer to prepare a resin varnish having a solid content of 50% by weight.

Example 5

A prepreg, a laminated board and multilayer printed wiring boards were prepared as described in Example 1 except that a resin varnish was prepared as described below.

In methyl ethyl ketone were dissolved and dispersed 30.0 parts by weight of a methoxynaphthalene dimethylene type epoxy resin (Dainippon Ink And Chemicals, Incorporated, EXA-7320) as an epoxy resin (A), 0.1 parts by weight of a curing catalyst (an imidazole compound; Shikoku Chemicals Corporation, "2-phenyl-4-methylimidazole") as a curing agent (B), 24.8 parts by weight of a novolac type cyanate resin (D) (Lonza Japan Ltd., PRIMASET PT-30) and 15.0 parts by weight of a phenoxy resin having a terminal epoxy group which was a copolymer of a bisphenol-A type epoxy resin and a bisphenol-F type epoxy resin (Japan Epoxy Resins Co., Ltd., "Epikote 4275", weight-average molecular weight: $6.0 \times 10^4$) as a phenoxy resin. Then, were added 30.0 parts by weight of spherical fused silica (ADMATECHS CO., LTD., "SO-25R", average particle size: 0.5 μm) as an inorganic filler (C) and 0.1 parts by weight of a coupling agent (Nippon Unicar Co., Ltd., A187) and the mixture was stirred for 10 min using a high-speed stirrer to prepare a resin varnish having a solid content of 50% by weight.

Example 6

A prepreg, a laminated board and multilayer printed wiring boards were prepared as described in Example 1 except that a resin varnish was prepared as described below.

In methyl ethyl ketone were dissolved and dispersed 10.5 parts by weight of a methoxynaphthalene dimethylene type epoxy resin (Dainippon Ink And Chemicals, Incorporated, EXA-7320) as an epoxy resin (A), 0.1 parts by weight of a curing catalyst (an imidazole compound; Shikoku Chemicals Corporation, "2-phenyl-4-methylimidazole") as a curing agent (B) and 14.0 parts by weight of a novolac type cyanate resin (D) (Lonza Japan Ltd., PRIMASET PT-30). Then, were added 75.0 parts by weight of spherical fused silica (ADMATECHS CO., LTD., "SO-25R", average particle size: 0.5 μm) as an inorganic filler (C) and 0.4 parts by weight of a coupling agent (Nippon Unicar Co., Ltd., A187) and the mixture was stirred for 10 min using a high-speed stirrer to prepare a resin varnish having a solid content of 50% by weight.

Example 7

A prepreg, a laminated board and multilayer printed wiring boards were prepared as described in Example 1 except that a resin varnish was prepared as described below.

In methyl ethyl ketone were dissolved and dispersed 21.5 parts by weight of a methoxynaphthalene dimethylene type epoxy resin (Dainippon Ink And Chemicals, Incorporated, EXA-7320) as an epoxy resin (A), 0.1 parts by weight of an imidazole compound (Shikoku Chemicals Corporation, "2-phenyl-4-methylimidazole") as a curing agent (B) and 3.0 parts by weight of a novolac type cyanate resin (D) (Lonza Japan Ltd., PRIMASET PT-30). Then, were added 75.0 parts by weight of spherical fused silica (ADMATECHS CO., LTD., "SO-25R", average particle size: 0.5 μm) as an inorganic filler (C) and 0.4 parts by weight of a coupling agent (Nippon Unicar Co., Ltd., A187) and the mixture was stirred for 10 min using a high-speed stirrer to prepare a resin varnish having a solid content of 50% by weight.

Example 8

A prepreg, a laminated board and multilayer printed wiring boards were prepared as described in Example 1 except that a resin varnish was prepared as described below.

In methyl ethyl ketone were dissolved and dispersed 23.8 parts by weight of a methoxynaphthalene dimethylene type epoxy resin (Dainippon Ink And Chemicals, Incorporated, EXA-7320) as an epoxy resin (A), 0.1 parts by weight of a curing catalyst (an imidazole compound; Shikoku Chemicals Corporation, "2-phenyl-4-methylimidazole") as a curing agent (B) and 46.0 parts by weight of a novolac type cyanate resin (D) (Lonza Japan Ltd., PRIMASET PT-30). Then, were added 30.0 parts by weight of spherical fused silica (ADMATECHS CO., LTD., "SO-25R", average particle size: 0.5 μm) as an inorganic filler (C) and 0.1 parts by weight of a coupling agent (Nippon Unicar Co., Ltd., A187) and the mixture was stirred for 10 min using a high-speed stirrer to prepare a resin varnish having a solid content of 50% by weight.

Example 9

A prepreg, a laminated board and multilayer printed wiring boards were prepared as described in Example 1 except that a resin varnish was prepared as described below.

In methyl ethyl ketone were dissolved and dispersed 13.9 parts by weight of a methoxynaphthalene dimethylene type epoxy resin (Dainippon Ink And Chemicals, Incorporated, EXA-7320) as an epoxy resin (A), 11.0 parts by weight of a biphenyl dimethylene type phenol resin (Nippon Kayaku Co., Ltd., GPH-103) as a curing agent (B) and 24.8 parts by weight of a novolac type cyanate resin (D) (Lonza Japan Ltd., PRIMASET PT-30). Then, were added 50.0 parts by weight of aluminum hydroxide (Showa Denko K. K., HP-350) as an inorganic filler (C) and 0.3 parts by weight of a coupling agent (Nippon Unicar Co., Ltd., A187) and the mixture was stirred for 10 min using a high-speed stirrer to prepare a resin varnish having a solid content of 50% by weight.

Example 10

A prepreg, a laminated board and multilayer printed wiring boards were prepared as described in Example 1 except that a resin varnish was prepared as described below.

In methyl ethyl ketone were dissolved and dispersed 13.9 parts by weight of a methoxynaphthalene dimethylene type epoxy resin (Dainippon Ink And Chemicals, Incorporated, EXA-7320) as an epoxy resin (A), 11.0 parts by weight of a biphenyl dimethylene type phenol resin (Nippon Kayaku Co., Ltd., GPH-103) as a curing agent (B) and 24.8 parts by weight of a novolac type cyanate resin (D) (Lonza Japan Ltd., PRIMASET PT-30). Then, were added 50.0 parts by weight of magnesium hydroxide (Kyowa Chemical Industry Co., Ltd., KISUMA 5A) as an inorganic filler (C) and 0.3 parts by weight of a coupling agent (Nippon Unicar Co., Ltd., A187) and the mixture was stirred for 10 min using a high-speed stirrer to prepare a resin varnish having a solid content of 50% by weight.

Example 11

A prepreg, a laminated board and multilayer printed wiring boards were prepared as described in Example 1 except that a resin varnish was prepared as described below.

In methyl ethyl ketone were dissolved and dispersed 13.9 parts by weight of a methoxynaphthalene dimethylene type epoxy resin (Dainippon Ink And Chemicals, Incorporated, EXA-7320) as an epoxy resin (A), 11.0 parts by weight of a biphenyl dimethylene type phenol resin (Nippon Kayaku Co., Ltd., GPH-103) as a curing agent (B) and 24.8 parts by weight of a novolac type cyanate resin (D) (Lonza Japan Ltd., PRIMASET PT-30). Then, were added 50.0 parts by weight of calcined talc (Fuji Talc Industrial Co., Ltd., ST-100) as an inorganic filler (C) and 0.3 parts by weight of a coupling agent (Nippon Unicar Co., Ltd., A187) and the mixture was stirred for 10 min using a high-speed stirrer to prepare a resin varnish having a solid content of 50% by weight.

Example 12

A prepreg, a laminated board and multilayer printed wiring boards were prepared as described in Example 1 except that a resin varnish was prepared as described below.

In methyl ethyl ketone were dissolved and dispersed 13.9 parts by weight of a methoxynaphthalene dimethylene type epoxy resin (Dainippon Ink And Chemicals, Incorporated, EXA-7320) as an epoxy resin (A), 11.0 parts by weight of a biphenyl dimethylene type phenol resin (Nippon Kayaku Co., Ltd., GPH-103) as a curing agent (B) and 24.8 parts by weight of a novolac type cyanate resin (D) (Lonza Japan Ltd., PRIMASET PT-30). Then, were added 50 parts by weight of alumina (Sumitomo Chemical Co., Ltd., C-301) as an inorganic filler (C) and 0.3 parts by weight of a coupling agent (Nippon Unicar Co., Ltd., A187) and the mixture was stirred for 10 min using a high-speed stirrer to prepare a resin varnish having a solid content of 50% by weight.

Example 13

A prepreg, a laminated board and multilayer printed wiring boards were prepared as described in Example 1 except that a resin varnish was prepared as described below.

In methyl ethyl ketone were dissolved and dispersed 23.8 parts by weight of a methoxynaphthalene dimethylene type epoxy resin (Dainippon Ink And Chemicals, Incorporated, EXA-7320) as an epoxy resin (A), 0.1 parts by weight of an imidazole compound (Shikoku Chemicals Corporation, "2-phenyl-4-methylimidazole") as a curing catalyst (B) and 46.0 parts by weight of a novolac type cyanate resin (D) (Lonza Japan Ltd., PRIMASET PT-30). Then, were added 30.0 parts by weight of spherical fused silica (ADMATECHS CO., LTD., "SO-25R", average particle size: 0.5 μm) as an inorganic filler (C) and 0.1 parts by weight of a coupling agent (Nippon Unicar Co., Ltd., A187) and the mixture was stirred for 10 min using a high-speed stirrer to prepare a resin varnish having a solid content of 50% by weight.

Example 14

A prepreg, a laminated board and multilayer printed wiring boards were prepared as described in Example 1 except that a resin varnish was prepared as described below.

In methyl ethyl ketone were dissolved and dispersed 3.0 parts by weight of a methoxynaphthalene dimethylene type epoxy resin (Dainippon Ink And Chemicals, Incorporated, EXA-7320) as an epoxy resin (A), 0.1 parts by weight of a curing catalyst (an imidazole compound; Shikoku Chemicals Corporation, "2-phenyl-4-methylimidazole") as a curing agent (B), 17.4 parts by weight of a novolac type cyanate resin (D) (Lonza Japan Ltd., PRIMASET PT-30), 11.0% by weight of a biphenyl dimethylene type epoxy resin (Nippon Kayaku Co., Ltd., NC-3000) and 3.5 parts by weight of a phenoxy resin having a terminal epoxy group which was a copolymer of a bisphenol-A type epoxy resin and a bisphenol-F type epoxy resin (Japan Epoxy Resins Co., Ltd., "Epikote 4275", weight-average molecular weight: $6.0 \times 10^4$) as a phenoxy resin. Then, were added 64.7 parts by weight of spherical fused silica (ADMATECHS CO., LTD., "SO-25R", average particle size: 0.5 μm) as an inorganic filler (C) and 0.3 parts by weight of a coupling agent and the mixture was stirred for 10 min using a high-speed stirrer to prepare a resin varnish having a solid content of 50% by weight.

Example 15

A prepreg, a laminated board and multilayer printed wiring boards were prepared as described in Example 1 except that a resin varnish was prepared as described below.

In methyl ethyl ketone were dissolved and dispersed 50.0 parts by weight of a methoxynaphthalene dimethylene type epoxy resin (Dainippon Ink And Chemicals, Incorporated, EXA-7320) as an epoxy resin (A), 0.1 parts by weight of a curing catalyst (an imidazole compound; Shikoku Chemicals Corporation, "2-phenyl-4-methylimidazole") as a curing agent (B), 4.8 parts by weight of a novolac type cyanate resin (D) (Lonza Japan Ltd., PRIMASET PT-30) and 15.0 parts by weight of a phenoxy resin having a terminal epoxy group which was a copolymer of a bisphenol-A type epoxy resin and a bisphenol-F type epoxy resin (Japan Epoxy Resins Co., Ltd., "Epikote 4275", weight-average molecular weight: $6.0 \times 10^4$) as a phenoxy resin. Then, were added 30.0 parts by weight of spherical fused silica (ADMATECHS CO., LTD., "SO-25R", average particle size: 0.5 μm) as an inorganic filler (C) and 0.1 parts by weight of a coupling agent and the mixture was stirred for 10 min using a high-speed stirrer to prepare a resin varnish having a solid content of 50% by weight.

Comparative Example 1

A prepreg, a laminated board and multilayer printed wiring boards were prepared as described in Example 1 except that a resin varnish was prepared as described below.

In methyl ethyl ketone were dissolved and dispersed 17.4 parts by weight of a novolac type cyanate resin (Lonza Japan Ltd., PRIMASET PT-30), 14.0 parts by weight of a biphenyl dimethylene type epoxy resin (Nippon Kayaku Co., Ltd., NC-3000) as an epoxy resin, 3.5 parts by weight of a phenoxy resin having a terminal epoxy group which was a copolymer of a bisphenol-A type epoxy resin and a bisphenol-F type epoxy resin (Japan Epoxy Resins Co., Ltd., "Epikote 4275", weight-average molecular weight $6.0 \times 10^4$) as a phenoxy resin and 0.1 parts by weight of a curing catalyst (an imidazole compound; Shikoku Chemicals Corporation, "2-phenyl-4-methylimidazole") as a curing agent (B). Then, were added 64.7 parts by weight of spherical fused silica (ADMATECHS CO., LTD., "SO-25R", average particle size: 0.5 μm) as an inorganic filler (C) and 0.3 parts by weight of a coupling agent (Nippon Unicar Co., Ltd., A187) and the mixture was stirred for 10 min using a high-speed stirrer to prepare a resin varnish having a solid content of 50% by weight.

Comparative Example 2

A prepreg, a laminated board and multilayer printed wiring boards were prepared as described in Example 1 except that a resin varnish was prepared as described below.

In methyl ethyl ketone were dissolved and dispersed 12.3 parts by weight of a novolac type cyanate resin (Lonza Japan Ltd., PRIMASET PT-30), 9.9 parts by weight of a biphenyl dimethylene type epoxy resin (Nippon Kayaku Co., Ltd., NC-3000H) as an epoxy resin, 2.4 parts by weight of a phenoxy resin having a terminal epoxy group which was a copolymer of a bisphenol-A type epoxy resin and a bisphenol-F type epoxy resin (Japan Epoxy Resins Co., Ltd., "Epikote 4275", weight-average molecular weight $6.0 \times 10^4$) as a phenoxy resin and 0.1 parts by weight of a curing catalyst (an imidazole compound; Shikoku Chemicals Corporation, "2-phenyl-4-methylimidazole") as a curing agent (B). Then, were added 74.9 parts by weight of spherical fused silica (ADMATECHS CO., LTD., "SO-25R", average particle size: 0.5 μm) as an inorganic filler (C) and 0.4 parts by weight of a coupling agent (Nippon Unicar Co., Ltd., A187) and the mixture was stirred for 10 min using a high-speed stirrer to prepare a resin varnish having a solid content of 50% by weight.

Comparative Example 3

A prepreg, a laminated board and multilayer printed wiring boards were prepared as described in Example 1 except that a resin varnish was prepared as described below.

In methyl ethyl ketone were dissolved and dispersed 28.8 parts by weight of a methoxynaphthalene dimethylene type epoxy resin (Dainippon Ink And Chemicals, Incorporated, EXA-7320) as an epoxy resin (A) and 0.8 parts by weight of a curing catalyst (an imidazole compound; Shikoku Chemicals Corporation, "2-phenyl-4-methylimidazole") as a curing agent (B). Then, were added 70.0 parts by weight of spherical fused silica (ADMATECHS CO., LTD., "SO-25R", average particle size: 0.5 μm) as an inorganic filler (C) and 0.4 parts by weight of a coupling agent (Nippon Unicar Co., Ltd., A187) and the mixture was stirred for 10 min using a high-speed stirrer to prepare a resin varnish having a solid content of 50% by weight.

Comparative Example 4

A prepreg, a laminated board and multilayer printed wiring boards were prepared as described in Example 1 except that a resin varnish was prepared as described below.

In methyl ethyl ketone were dissolved and dispersed 28.8 parts by weight of a methoxynaphthalene dimethylene type epoxy resin (Dainippon Ink And Chemicals, Incorporated, EXA-7320) as an epoxy resin (A) and 0.8 parts by weight of a curing catalyst (an imidazole compound; Shikoku Chemicals Corporation, "2-phenyl-4-methylimidazole") as a curing agent (B). Then, were added 70.0 parts by weight of aluminum hydroxide (Showa Denko K. K., HP-350) as an inorganic filler (C) and 0.4 parts by weight of a coupling agent (Nippon Unicar Co., Ltd., A187) and the mixture was stirred for 10 min using a high-speed stirrer to prepare a resin varnish having a solid content of 50% by weight.

The following evaluation was conducted for the resin compositions obtained in these examples and comparative examples. Evaluation parameters are indicated with items. The results are shown in Table 1.

TABLE 1

| | | | Example. 1 | Example. 2 | Example. 3 | Example. 4 |
|---|---|---|---|---|---|---|
| Composition (wt parts) | Epoxy resin (A) | EXA-7320 | 13.9 | 14.0 | 4.0 | 42.0 |
| | Curing agent (B) | Phenol resin (GPH-103) | 11.0 | | | |
| | | Curing accelerator (2P4MZ) | | 0.1 | 0.1 | 0.1 |
| | Thermosetting resin | Cyanate resin (D) (PT-30) | 24.8 | 17.4 | 27.4 | 12.9 |
| | | Epoxy resin (NC-3000) | | | | |
| | Other resin | Phenoxy resin (EP-4275) | | 3.5 | 3.5 | 5.0 |
| | Inorganic filler (C) | Spherical fused silica (SO-25R) | 50.0 | 64.7 | 64.7 | 39.8 |
| | | Aluminum (HP-350) | | | | |
| | | Magnesium hydroxide (KISUMA 5A) | | | | |
| | | Calcined talc (ST-100) | | | | |
| | | Alumina (C-301) | | | | |
| | Coupling agent | A-187 | 0.3 | 0.3 | 0.3 | 0.2 |
| Evaluation | Linear expansion coefficient (ppm/° C.) | | 9 | 9 | 7 | 10 |
| | Minimum melt viscosity of a resin composition (Pa · s) | | $2.0 \times 10^1$ | $3.0 \times 10^1$ | $2.0 \times 10^2$ | $2.0 \times 10^1$ |
| | Moldability of a laminated board | | ⊚ | ⊚ | ⊚ | ⊚ |
| | Moldability of a multilayer printed wiring board (presence of voids) | | ○ | ○ | ○ | ○ |
| | Flame resistance test (double-sided board with a thickness of 1 mm) | | V-0 | V-0 | V-0 | Burnout |
| | Solder heat resistance | | No problem | No problem | No problem | No problem |

| | | | Example. 5 | Example. 6 | Example. 7 |
|---|---|---|---|---|---|
| Composition (wt parts) | Epoxy resin (A) | EXA-7320 | 30.0 | 10.5 | 21.5 |
| | Curing agent (B) | Phenol resin (GPH-103) | | | |
| | | Curing accelerator (2P4MZ) | 0.1 | 0.1 | 0.1 |
| | Thermosetting resin | Cyanate resin (D) (PT-30) | 24.8 | 14.0 | 3.0 |
| | | Epoxy resin (NC-3000) | | | |
| | Other resin | Phenoxy resin (EP-4275) | 15.0 | | |
| | Inorganic filler (C) | Spherical fused silica (SO-25R) | 30.0 | 75.0 | 75.0 |
| | | Aluminum (HP-350) | | | |
| | | Magnesium hydroxide (KISUMA 5A) | | | |
| | | Calcined talc (ST-100) | | | |
| | | Alumina (C-301) | | | |
| | Coupling agent | A-187 | 0.1 | 0.4 | 0.4 |
| Evaluation | Linear expansion coefficient (ppm/° C.) | | 10 | 7 | 7 |
| | Minimum melt viscosity of a resin composition (Pa · s) | | $2.0 \times 10^1$ | $3.0 \times 10^3$ | $4.0 \times 10^3$ |
| | Moldability of a laminated board | | ⊚ | ⊚ | ⊚ |
| | Moldability of a multilayer printed wiring board (presence of voids) | | ○ | ○ | ○ |
| | Flame resistance test (double-sided board with a thickness of 1 mm) | | Burnout | V-0 | V-0 |
| | Solder heat resistance | | No problem | No problem | No problem |

TABLE 1-continued

|  |  |  | Example. 8 | Example. 9 |
|---|---|---|---|---|
| Composition (wt parts) | Epoxy resin (A) | EXA-7320 | 23.8 | 13.9 |
|  | Curing agent (B) | Phenol resin (GPH-103) |  | 11.0 |
|  |  | Curing accelerator (2P4MZ) | 0.1 |  |
|  | Thermosetting resin | Cyanate resin (D) (PT-30) | 46.0 | 24.8 |
|  |  | Epoxy resin (NC-3000) |  |  |
|  | Other resin | Phenoxy resin (EP-4275) |  |  |
|  | Inorganic filler (C) | Spherical fused silica (SO-25R) | 30.0 |  |
|  |  | Aluminum (HP-350) |  | 50.0 |
|  |  | Magnesium hydroxide (KISUMA 5A) |  |  |
|  |  | Calcined talc (ST-100) |  |  |
|  |  | Alumina (C-301) |  |  |
|  | Coupling agent | A-187 | 0.1 | 0.3 |
| Evaluation | Linear expansion coefficient (ppm/° C.) |  | 10 | 10 |
|  | Minimum melt viscosity of a resin composition (Pa·s) |  | $2.0 \times 10^1$ | $1.0 \times 10^1$ |
|  | Moldability of a laminated board |  | ◯◯ | ◯◯ |
|  | Moldability of a multilayer printed wiring board (presence of voids) |  | ◯ | ◯ |
|  | Flame resistance test (double-sided board with a thickness of 1 mm) |  | Burnout | V-0 |
|  | Solder heat resistance |  | No problem | No problem |

|  |  |  | Example. 10 | Example. 11 |
|---|---|---|---|---|
| Composition (wt parts) | Epoxy resin (A) | EXA-7320 | 13.9 | 13.9 |
|  | Curing agent (B) | Phenol resin (GPH-103) | 11.0 | 11.0 |
|  |  | Curing accelerator (imidazole) |  |  |
|  | Thermosetting resin | Cyanate resin (PT-30) | 24.8 | 24.8 |
|  |  | Epoxy resin (NC-3000) |  |  |
|  |  | Epoxy resin (NC-3000H) |  |  |
|  | Other resin | Phenoxy resin (EP-4275) |  |  |
|  | Inorganic filler (C) | Spherical fused silica (SO-25R) |  |  |
|  |  | Aluminum (HP-350) |  |  |
|  |  | Magnesium hydroxide (KISUMA 5A) | 50.0 |  |
|  |  | Calcined talc (ST-100) |  | 50.0 |
|  |  | Alumina (C-301) |  |  |
|  | Coupling agent | A-187 | 0.3 | 0.3 |
| Evaluation | Linear expansion coefficient (ppm/° C.) |  | 10 | 9 |
|  | Minimum melt viscosity of a resin composition (Pa·s) |  | $1.0 \times 10$ | $5.0 \times 10$ |
|  | Moldability of a laminated board |  | ◯◯ | ◯◯ |
|  | Moldability of a multilayer printed wiring board (presence of voids) |  | ◯ | ◯ |
|  | Flame resistance test (double-sided board with a thickness of 0.1 mm) |  | V-0 | V-0 |
|  | Solder heat resistance |  | No problem | No problem |

|  |  |  | Example. 12 | Example. 13 |
|---|---|---|---|---|
| Composition (wt parts) | Epoxy resin (A) | EXA-7320 | 13.9 | 23.8 |
|  | Curing agent (B) | Phenol resin (GPH-103) | 11.0 |  |
|  |  | Curing accelerator (imidazole) |  | 0.1 |
|  | Thermosetting resin | Cyanate resin (PT-30) | 24.8 | 46.0 |
|  |  | Epoxy resin (NC-3000) |  |  |
|  |  | Epoxy resin (NC-3000H) |  |  |
|  | Other resin | Phenoxy resin (EP-4275) |  |  |
|  | Inorganic filler (C) | Spherical fused silica (SO-25R) |  | 30.0 |
|  |  | Aluminum (HP-350) |  |  |
|  |  | Magnesium hydroxide (KISUMA 5A) |  |  |
|  |  | Calcined talc (ST-100) |  |  |
|  |  | Alumina (C-301) | 50.0 |  |
|  | Coupling agent | A-187 | 0.3 | 0.1 |

TABLE 1-continued

| | | | | |
|---|---|---|---|---|
| Evaluation | Linear expansion coefficient (ppm/° C.) | | 9 | 10 |
| | Minimum melt viscosity of a resin composition (Pa·s) | | $4.0 \times 10$ | $2.0 \times 10$ |
| | Moldability of a laminated board | | ⊙⊙ | ⊙⊙ |
| | Moldability of a multilayer printed wiring board (presence of voids) | | ○ | ○ |
| | Flame resistance test (double-sided board with a thickness of 0.1 mm) | | V-0 | Burnout |
| | Solder heat resistance | | No problem | No problem |

| | | | Example. 14 | Example. 15 |
|---|---|---|---|---|
| Composition (wt parts) | Epoxy resin (A) | EXA-7320 | 3.0 | 50.0 |
| | Curing agent (B) | Phenol resin (GPH-103) | | |
| | | Curing accelerator (imidazole) | 0.1 | 0.1 |
| | Thermosetting resin | Cyanate resin (PT-30) | 17.4 | 4.8 |
| | | Epoxy resin (NC-3000) | 11.0 | |
| | | Epoxy resin (NC-3000H) | | |
| | Other resin | Phenoxy resin (EP-4275) | 3.5 | 15.0 |
| | Inorganic filler (C) | Spherical fused silica (SO-25R) | 64.7 | 30.0 |
| | | Aluminum (HP-350) | | |
| | | Magnesium hydroxide (KISUMA 5A) | | |
| | | Calcined talc (ST-100) | | |
| | | Alumina (C-301) | | |
| | Coupling agent | A-187 | 0.3 | 0.1 |
| Evaluation | Linear expansion coefficient (ppm/° C.) | | 9 | 12 |
| | Minimum melt viscosity of a resin composition (Pa·s) | | $8.0 \times 10$ | 8 |
| | Moldability of a laminated board | | ⊙⊙ | ⊙⊙ |
| | Moldability of a multilayer printed wiring board (presence of voids) | | ○ | ○ |
| | Flame resistance test (double-sided board with a thickness of 0.1 mm) | | V-0 | Burnout |
| | Solder heat resistance | | No problem | No problem |

| | | | Comparative. Example. 1 | Comparative. Example. 2 |
|---|---|---|---|---|
| Composition (wt parts) | Epoxy resin (A) | EXA-7320 | | |
| | Curing agent (B) | Phenol resin (GPH-103) | | |
| | | Curing accelerator (imidazole) | 0.1 | 0.1 |
| | Thermosetting resin | Cyanate resin (PT-30) | 17.4 | 12.3 |
| | | Epoxy resin (NC-3000) | 14.0 | |
| | | Epoxy resin (NC-3000H) | | 9.9 |
| | Other resin | Phenoxy resin (EP-4275) | 3.5 | 2.4 |
| | Inorganic filler (C) | Spherical fused silica (SO-25R) | 64.7 | 74.9 |
| | | Aluminum (HP-350) | | |
| | | Magnesium hydroxide (KISUMA 5A) | | |
| | | Calcined talc (ST-100) | | |
| | | Alumina (C-301) | | |
| | Coupling agent | A-187 | 0.3 | 0.4 |
| Evaluation | Linear expansion coefficient (ppm/° C.) | | 9 | 7 |
| | Minimum melt viscosity of a resin composition (Pa·s) | | $8.0 \times 10$ | $1.0 \times 10^4$ |
| | Moldability of a laminated board | | X | ○ |
| | Moldability of a multilayer printed wiring board (presence of voids) | | ○ | X |
| | Flame resistance test (double-sided board with a thickness of 0.1 mm) | | V-0 | V-0 |
| | Solder heat resistance | | No problem | Swelling |

| | | | Comparative. Example. 3 | Comparative. Example. 4 |
|---|---|---|---|---|
| Composition (wt parts) | Epoxy resin (A) | EXA-7320 | 28.8 | 28.8 |
| | Curing agent (B) | Phenol resin (GPH-103) | | |
| | | Curing accelerator (imidazole) | 0.8 | 0.8 |
| | Thermosetting resin | Cyanate resin (PT-30) | | |
| | | Epoxy resin (NC-3000) | | |
| | | Epoxy resin (NC-3000H) | | |
| | Other resin | Phenoxy resin (EP-4275) | | |
| | Inorganic filler (C) | Spherical fused silica (SO-25R) | 70.0 | |
| | | Aluminum (HP-350) | | 70.0 |
| | | Magnesium hydroxide (KISUMA 5A) | | |
| | | Calcined talc (ST-100) | | |
| | | Alumina (C-301) | | |
| | Coupling agent | A-187 | 0.4 | 0.4 |

TABLE 1-continued

| Evaluation | | | |
|---|---|---|---|
| Linear expansion coefficient (ppm/° C.) | | 9 | 10 |
| Minimum melt viscosity of a resin composition (Pa · s) | | $1.0 \times 10^3$ | $8.0 \times 10^2$ |
| Moldability of a laminated board | | ◯◯ | ◯◯ |
| Moldability of a multilayer printed wiring board (presence of voids) | | ◯ | ◯ |
| Flame resistance test (double-sided board with a thickness of 0.1 mm) | | V-0 | V-0 |
| Solder heat resistance | | No problem | No problem |

1. Thermal Expansion Coefficient

The whole surface of a copper foil in a laminated board with a thickness of 0.2 mm was etched and the resulting laminated board was cut into a test piece having a size of 4 mm×20 mm, for which a linear expansion coefficient (an average linear expansion coefficient) in a planar direction was determined from 50° C. to 100° C. at a rate of 5° C./min using a TMA, demonstrating that an expected linear expansion coefficient was practically obtained.

2. Minimum Melt Viscosity of a Resin Composition

For the prepreg thus obtained, a minimum melt viscosity from 50° C. to 200° C. was determined at a temperature-rise rate of 5° C./min and a frequency of 10 Hz, using a viscoelasticity measuring instrument (Anton Paar Co., Ltd., Physica MCR Series).

3. Moldability of a Laminated Board

The double-sided copper-clad laminated board obtained was subjected to copper-foil etching, and its appearance was observed to determine whether separation of the inorganic component and the resin component occurred or not. The board was rated as ◯◯ when an average length of a streak derived from separation between the inorganic component and the resin component in the periphery is less than 4 mm, ◯ when the average length is 4 mm or more and less than 8 mm and × when the average length is and 8 mm or more, respectively.

4. Moldability of a Multilayer Printed Wiring Board

The central part of the multilayer printed wiring board A obtained was cut and its cross section was observed. It was rated as × when one or more voids due to inadequate filling were observed and ◯ when no voids were observed.

5. Solder Heat Resistance

The multilayer printed wiring board B obtained was cut into a 50 mm×50 mm sample, which was ¾ etched, treated with PCT-2/121 and immersed in a solder at 260° C. for 30 sec, and the presence of swelling was observed.

6. Flame Retardancy

A test piece of a laminated board (thickness: 1 mm, prepared by press-molding copper foils on both sides of a prepreg and etching the copper foils in both sides) was measured by a vertical method in accordance with the UL-94 specification.

In Table 1, V-0 indicates good results.

Examples 1 to 15, which employed an insulating resin composition of the present invention, exhibited good evaluation results in general, and indicated satisfactory molding status without molding defects after etching of the copper foil in the laminated board. In contrast, for Comparative Example 1, in which a methoxynaphthalene dimethylene type epoxy resin was not used, separation between the inorganic filler and the resin component was observed in the periphery after etching the copper foil in the laminated board. For Comparative Example 2, in which a resin had a higher melt viscosity and the composition also had a higher melt viscosity, separation between the inorganic component and the resin component was not observed in the appearance after etching the copper foil in the laminated board, but an inner circuit could not be buried in the process for manufacturing a multilayer printed wiring board, molding defects were observed and swelling occurred in the solder heat resistance test.

Furthermore, Comparative Example 3 had a considerably higher minimum melt viscosity than that for Example 11 or 12 having a nearly comparable linear expansion coefficient. Therefore, an inorganic filler must be used more than Example 11 or 12, leading to a problem that condition margin in press molding was narrowed.

Likewise, Comparative Example 4 had the problem as in Comparative Example 3.

Example 16

1. Preparation of an Insulating Resin Sheet

In methyl isobutyl ketone were dissolved and dispersed 35.0 parts by weight of methoxynaphthalene dimethylene type epoxy resin (Dainippon Ink And Chemicals, Incorporated, EXA-7320) as the epoxy resin (A), 0.2 parts by weight of 1-benzyl-2-phenyl imidazole (Shikoku Chemicals Corporation, Curezol 1B2PZ) as a curing agent (B), 5.0 parts by weight of a phenoxy resin (Japan Epoxy Resins Co., Ltd., jER4275) and 20.0 parts by weight of a novolac type cyanate resin (Lonza Japan Ltd., PRIMASET PT-30). Then, were added 39.6 parts by weight of spherical fused silica (ADMATECHS CO., LTD., "SO-25R", average particle size: 0.5 μm) as an inorganic filler (C) and 0.2 parts by weight of an epoxysilane coupling agent (GE TOSHIBA SILICONES CO., LTD., A-187), and the mixture was stirred for 10 min using a high-speed stirrer, to prepare a resin varnish having a solid content of 50% by weight.

One side of a PET (polyethylene terephthalate) film (Mitsubishi Polyester Film Co., Ltd., Diafoil MRX-50) with a thickness of 50 μm was coated with the resin varnish thus prepared using a comma coater such that the insulating resin layer had a thickness of 40 μm after drying, and the product was dried in an oven at 150° C. for 10 min, to prepare an insulating resin sheet.

2. Preparation of a Multilayer Printed Wiring Board C

The insulating resin sheets obtained above were laminated on an inner circuit board having predetermined inner circuit patterns in both sides such that the insulating resin layer surfaces of the insulating resin sheets were inside, and the laminate was molded under heating and pressure in vacuo at a temperature of 100° C. and a pressure of 1 MPa using a vacuum pressing laminator and then cured by heating in a hot air dryer at 170° C. for 60 min to prepare a multilayer printed wiring board C.

The inner circuit board was the following copper-clad laminated board.

Insulating resin layer: Halogen-free FR-4 material, thickness: 0.4 mm;

Conductor layer: copper foil, thickness: 18 μm, L/S=120/180 μm, clearance hole: 1 mmφ, 3 mmφ, slit: 2 mm.

3. Preparation of a Multilayer Printed Wiring Board D

The base material was peeled from the multilayer printed wiring board C obtained above, and an opening with a size of φ 60 μm (blind via hole) was used a carbon dioxide laser, and the product was immersed in a swelling solution (Atotech Japan Co., Ltd., Swelling Dip Securiganth P) at 70° C. and then in an aqueous solution of potassium permanganate (Atotech Japan Co., Ltd., Concentrate Compact CP) at 80° C. for 20 min, and was then neutralized for roughening. Then, after delipidation, catalyst addition and activation, an electroless copper plating film was formed to about 0.5 μm as a power-feeding layer. Next, on the surface of the power-feeding layer was laminated an ultraviolet-sensitive dry film (Asahi Kasei Corporation, AQ-2558) with a thickness of 25 μm by a hot-roll laminator, and it was aligned using a chrome evaporation mask in which a pattern having a minimum width/line distance of 20/20 μm (Touwa Process Co., Ltd.), exposed using an exposure device (Ushio, Inc., UX-1100SM-AJN01), developed with an aqueous solution of sodium carbonate to form a plating resist.

Subsequently, using the power-feeding layer as an electrode, electrolytic copper plating (Okuno Chemical Industries Co., Ltd., 81-HL) was conducted at 3 A/dm$^2$ for 30 min to form a copper interconnection having a thickness of about 25 μm. Here, using a two-step peeler, the plating resist was peeled off. The chemical solution used were a monoethanolamine solution (Mitsubishi Gas Chemical Co., Inc., R-100) for the aqueous alkali solution layer in the first step, an aqueous solution containing potassium permanganate and sodium hydroxide (Nippon MacDermid Co., Inc., Ltd., Macudizer 9275, 9276) as an oxidative resin etchant in the second step, and an aqueous acidic amine solution (Nippon MacDermid Co., Inc., Ltd., Macudizer 9279) for neutralization.

Next, the power-feeding layer was etched off by immersing it in an aqueous solution of ammonium persulfate (Meltex, Inc., AD-485) for ensuring insulation between interconnections. Then, the insulating resin layer was subjected to final curing at 200° C. for 60 min, and finally, a solder resist (Taiyo Ink Mfg. Co., Ltd., PSR4000/AUS308) was formed on the circuit surface, developed such that appropriate elements such as a connecting electrode for mounting a semiconductor element were exposed, and exposed using a predetermined mask, developed and cured to form a solder resist layer with a thickness of 12 μm on the circuit.

Then, over the circuit layer exposed from the solder resist layer was formed an electroless nickel plating layer of 3 μm, over which was then formed a plating layer consisting of an electroless gold plating layer of 0.1 μm, to prepare a multilayer printed wiring board D.

4. Preparation of a Semiconductor Device

The multilayer-printed laminated board D thus obtained was cut into a size of 50 mm×50 mm, to which a semiconductor element with a thickness of 0.75 mm and a size of 15 mm×15 mm was bonded using a flip-chip bonder in a reflow furnace, and the product was filled with a liquid sealing resin (Sumitomo Bakelite Co., Ltd., CRP-4152S), the liquid sealing resin was cured to prepare a semiconductor device. The curing of the liquid sealing resin was conducted at a temperature of 150° C. for 120 min.

Example 17

An insulating resin sheet, a multilayer printed wiring board C, a multilayer printed wiring board D and a semiconductor device were prepared as described in Example 16 except that a resin varnish was prepared as described below.

In methyl isobutyl ketone were dissolved and dispersed 3.0 parts by weight of a methoxynaphthalene dimethylene type epoxy resin (Dainippon Ink And Chemicals, Incorporated, EXA-7320) as the epoxy resin (A), 22.0 parts by weight of a biphenyl dimethylene type epoxy resin (Nippon Kayaku Co., Ltd., NC-3000), 0.2 parts by weight of 1-benzyl-2-phenyl imidazole (Shikoku Chemicals Corporation, Curezol 1B2PZ) as a curing agent (B), 10.0 parts by weight of a phenoxy resin (Japan Epoxy Resins Co., Ltd., jER4275) and 25 parts by weight of a novolac type cyanate resin (Lonza Japan Ltd., PRIMASET PT-30). Then, were added 39.6 parts by weight of spherical fused silica (ADMATECHS CO., LTD., "SO-25R", average particle size: 0.5 μm) as an inorganic filler (C) and 0.2 parts by weight of an epoxysilane coupling agent (GE TOSHIBA SILICONES CO., LTD., A-187) and the mixture was stirred for 10 min using a high-speed stirrer, to prepare a resin varnish having a solid content of 50% by weight.

Example 18

An insulating resin sheet, a multilayer printed wiring board C, a multilayer printed wiring board D and a semiconductor device were prepared as described in Example 16 except that a resin varnish was prepared as described below.

In methyl isobutyl ketone were dissolved and dispersed 42.0 parts by weight of a methoxynaphthalene dimethylene type epoxy resin (Dainippon Ink And Chemicals, Incorporated, EXA-7320) as the epoxy resin (A), 0.2 parts by weight of 1-benzyl-2-phenyl imidazole (Shikoku Chemicals Corporation, Curezol 1B2PZ) as a curing agent (B), 8.0 parts by weight of a phenoxy resin (Japan Epoxy Resins Co., Ltd., jER4275) and 10.0 parts by weight of a novolac type cyanate resin (Lonza Japan Ltd., PRIMASET PT-30). Then, were added 39.6 parts by weight of spherical fused silica (ADMATECHS CO., LTD., "SO-25R", average particle size: 0.5 μm) as an inorganic filler (C) and 0.2 parts by weight of an epoxysilane coupling agent (GE TOSHIBA SILICONES CO., LTD., A-187) and the mixture was stirred for 10 min using a high-speed stirrer, to prepare a resin varnish having a solid content of 50% by weight.

Example 19

An insulating resin sheet, a multilayer printed wiring board C, a multilayer printed wiring board D and a semiconductor device were prepared as described in Example 16 except that a resin varnish was prepared as described below.

In methyl isobutyl ketone were dissolved and dispersed 2.0 parts by weight of a methoxynaphthalene dimethylene type epoxy resin represented by the following formula (Dainippon Ink And Chemicals, Incorporated, EXA-7320) as the epoxy resin (A), 23.0 parts by weight of a biphenyl dimethylene type epoxy resin (Nippon Kayaku Co., Ltd., NC-3000), 0.2 parts by weight of 1-benzyl-2-phenyl imidazole (Shikoku Chemicals Corporation, Curezol 1B2PZ) as a curing agent (B), 10.0 parts by weight of a phenoxy resin (Japan Epoxy Resins Co., Ltd., jER4275) and 25.0 parts by weight of a novolac type cyanate resin (Lonza Japan Ltd., PRIMASET PT-30). Then, were added 39.6 parts by weight of spherical fused silica (ADMATECHS CO., LTD., "SO-25R", average particle size: 0.5 μm) as an inorganic filler (C) and 0.2 parts by weight of an epoxysilane coupling agent (GE TOSHIBA SILICONES CO., LTD., A-187) and the mixture was stirred for 10 min using a high-speed stirrer, to prepare a resin varnish having a solid content of 50% by weight.

Example 20

An insulating resin sheet, a multilayer printed wiring board C, a multilayer printed wiring board D and a semiconductor device were prepared as described in Example 16 except that a resin varnish was prepared as described below.

In methyl isobutyl ketone were dissolved and dispersed 45.0 parts by weight of a methoxynaphthalene dimethylene type epoxy resin (Dainippon Ink And Chemicals, Incorporated, EXA-7320) as the epoxy resin (A), 0.2 parts by weight of 1-benzyl-2-phenyl imidazole (Shikoku Chemicals Corporation, Curezol 1B2PZ) as a curing agent (B), 7.0 parts by weight of a phenoxy resin (Japan Epoxy Resins Co., Ltd., jER4275) and 8.0 parts by weight of a novolac type cyanate resin (Lonza Japan Ltd., PRIMASET PT-30). Then, were added 39.6 parts by weight of spherical fused silica (ADMATECHS CO., LTD., "SO-25R", average particle size: 0.5 μm) as an inorganic filler (C) and 0.2 parts by weight of an epoxysilane coupling agent (GE TOSHIBA SILICONES CO., LTD., A-187) and the mixture was stirred for 10 min using a high-speed stirrer, to prepare a resin varnish having a solid content of 50% by weight.

Example 21

An insulating resin sheet, a multilayer printed wiring board C, a multilayer printed wiring board D and a semiconductor device were prepared as described in Example 16 except that a resin varnish was prepared as described below.

In methyl isobutyl ketone were dissolved and dispersed 30.0 parts by weight of a methoxynaphthalene dimethylene type epoxy resin (Dainippon Ink And Chemicals, Incorporated, EXA-7320) as the epoxy resin (A), 0.2 parts by weight of 1-benzyl-2-phenyl imidazole (Shikoku Chemicals Corporation, Curezol 1B2PZ) as a curing agent (B), 15.0 parts by weight of a phenoxy resin (Japan Epoxy Resins Co., Ltd., jER4275) and 15.0 parts by weight of a novolac type cyanate resin (Lonza Japan Ltd., PRIMASET PT-30). Then, were added 39.6 parts by weight of spherical fused silica (ADMATECHS CO., LTD., "SO-25R", average particle size: 0.5 μm) as an inorganic filler (C) and 0.2 parts by weight of an epoxysilane coupling agent (GE TOSHIBA SILICONES CO., LTD., A-187) and the mixture was stirred for 10 min using a high-speed stirrer, to prepare a resin varnish having a solid content of 50% by weight.

Comparative Example 5

An insulating resin sheet, multilayer printed wiring boards C and D, and a semiconductor device were prepared as described in Example 16, except that a resin varnish was prepared as described below.

In methyl isobutyl ketone were dissolved and dispersed 20.0 parts by weight of a biphenyl dimethylene type epoxy resin (Nippon Kayaku Co., Ltd., NC-3000), 0.2 parts by weight of 1-benzyl-2-phenyl imidazole (Shikoku Chemicals Corporation, Curezol 1B2PZ) as a hardening accelerator (B), 15.0 parts by weight of a phenoxy resin (Japan Epoxy Resins Co., Ltd., jER4275) and 25.0 parts by weight of a novolac type cyanate resin (Lonza Japan Ltd., PRIMASET PT-30). Then, were added 39.6 parts by weight of spherical fused silica (ADMATECHS CO., LTD., "SO-25R", average particle size: 0.5 μm) as an inorganic filler and 0.2 parts by weight of an epoxysilane coupling agent (GE TOSHIBA SILICONES CO., LTD., A-187), and the mixture was stirred using a high-speed stirrer for 10 min, to prepare a resin varnish having a solid content of 50% by weight.

Comparative Example 6

An insulating resin sheet, multilayer printed wiring boards C and D, and a semiconductor device were prepared as described in Example 16, except that a resin varnish was prepared as described below.

In methyl isobutyl ketone were dissolved and dispersed 20.0 parts by weight of a biphenyl dimethylene type epoxy resin (Nippon Kayaku Co., Ltd., NC-3000), 0.2 parts by weight of 1-benzyl-2-phenyl imidazole (Shikoku Chemicals Corporation, Curezol 1B2PZ) as a hardening accelerator (B) and 40.0 parts by weight of a novolac type cyanate resin (Lonza Japan Ltd., PRIMASET PT-30). Then, were added 39.6 parts by weight of spherical fused silica (ADMATECHS CO., LTD., "SO-25R", average particle size: 0.5 μm) as an inorganic filler and 0.2 parts by weight of an epoxysilane coupling agent (GE TOSHIBA SILICONES CO., LTD., A-187), and the mixture was stirred using a high-speed stirrer for 10 min, to prepare a resin varnish having a solid content of 50% by weight.

Comparative Example 7

An insulating resin sheet, multilayer printed wiring boards C and D, and a semiconductor device were prepared as described in Example 16, except that a resin varnish was prepared as described below.

In methyl isobutyl ketone were dissolved and dispersed 30.0 parts by weight of a biphenyl dimethylene type epoxy resin (Nippon Kayaku Co., Ltd., NC-3000), 0.2 parts by weight of 1-benzyl-2-phenyl imidazole (Shikoku Chemicals Corporation, Curezol 1B2PZ) as a hardening accelerator (B), 2.0 parts by weight of a phenoxy resin (Japan Epoxy Resins Co., Ltd., jER4275) and 28.0 parts by weight of a novolac type cyanate resin (Lonza Japan Ltd., PRIMASET PT-30). Then, were added 39.6 parts by weight of spherical fused silica (ADMATECHS CO., LTD., "SO-25R", average particle size: 0.5 μm) as an inorganic filler and 0.2 parts by weight of an epoxysilane coupling agent (GE TOSHIBA SILICONES CO., LTD., A-187), and the mixture was stirred using a high-speed stirrer for 10 min, to prepare a resin varnish having a solid content of 50% by weight.

Comparative Example 8

An insulating resin sheet, multilayer printed wiring boards C and D, and a semiconductor device were prepared as described in Example 16, except that a resin varnish was prepared as described below.

In methyl isobutyl ketone were dissolved and dispersed 10.0 parts by weight of a biphenyl dimethylene type epoxy resin (Nippon Kayaku Co., Ltd., NC-3000), 0.2 parts by weight of 1-benzyl-2-phenyl imidazole (Shikoku Chemicals Corporation, Curezol 1B2PZ) as a hardening accelerator, 5.0 parts by weight of a phenoxy resin (Japan Epoxy Resins Co., Ltd., jER4275) and 15.0 parts by weight of a novolac type cyanate resin (Lonza Japan Ltd., PRIMASET PT-30). Then, were added 69.4 parts by weight of spherical fused silica (ADMATECHS CO., LTD., "SO-25R", average particle size: 0.5 μm) as an inorganic filler and 0.4 parts by weight of an epoxysilane coupling agent (GE TOSHIBA SILICONES CO., LTD., A-187), and the mixture was stirred using a high-speed stirrer for 10 min, to prepare a resin varnish having a solid content of 50% by weight.

Comparative Example 9

An insulating resin sheet, multilayer printed wiring boards C and D, and a semiconductor device were prepared as described in Example 16, except that a resin varnish was prepared as described below.

In methyl isobutyl ketone were dissolved and dispersed 59.6 parts by weight of a biphenyl dimethylene type epoxy resin (Nippon Kayaku Co., Ltd., NC-3000), 0.4 parts by weight of 1-benzyl-2-phenyl imidazole (Shikoku Chemicals Corporation, Curezol 1B2PZ) as a hardening accelerator, 20.0 parts by weight of a phenoxy resin (Japan Epoxy Resins Co., Ltd., jER4275) and 20.0 parts by weight of a novolac type cyanate resin (Lonza Japan Ltd., PRIMASET PT-30), to prepare a resin varnish having a solid content of 50% by weight.

Table 2 shows the compositions and the evaluation results for the resin compositions used for preparing the insulating resin sheets in Examples, and Table 3 shows the compositions and the evaluation results for the resin compositions in Comparative Examples. In these tables, the amounts are in "parts by weight".

TABLE 2

|  | Example. 16 | Example. 17 | Example. 18 |
|---|---|---|---|
| Epoxy resin (A) | 35.0 | 3.0 | 42.0 |
| Biphenyldimetylene type epoxy resin |  | 22.0 |  |
| Curing agent (B) | 0.2 | 0.2 | 0.2 |
| Phenoxy resin | 5.0 | 10.0 | 8.0 |
| Inorganic filler (C) | 39.6 | 39.6 | 39.6 |
| Novolac type cyanate resin | 20.0 | 25.0 | 10.0 |
| Epoxysilane coupling agent | 0.2 | 0.2 | 0.2 |
| Total | 100.0 | 100.0 | 100.0 |
| Evaluation Items |  |  |  |
| Linear expansion coefficient (ppm/° C.) | ○ 32 | ○ 32 | ○ 33 |
| Solder heat resistance after moisture absorption | ○ | ○ | ○ |
| Observation of the presence of molding voids | ○ | ○ | ○ |
| Moldability | ○○ | ○○ | ○○ |
| Surface roughness (Ra) | ○ | ○ | ○ |
| Cracks | ○ | ○ | ○ |
| Plating peel | ○ | ○ | ○ |
| Heat shock test | ○ | ○ | ○ |

|  | Example. 19 | Example. 20 | Example. 21 |
|---|---|---|---|
| Epoxy resin (A) | 2.0 | 45.0 | 30.0 |
| Biphenyldimetylene type epoxy resin | 23.0 |  |  |
| Curing agent (B) | 0.2 | 0.2 | 0.2 |
| Phenoxy resin | 10.0 | 7.0 | 15.0 |
| Inorganic filler (C) | 39.6 | 39.6 | 39.6 |
| Novolac type cyanate resin | 25.0 | 8.0 | 15.0 |
| Epoxysilane coupling agent | 0.2 | 0.2 | 0.2 |
| Total | 100.0 | 100.0 | 100.0 |
| Evaluation Items |  |  |  |
| Linear expansion coefficient (ppm/° C.) | ○ 32 | ○ 33 | ○ 34 |
| Solder heat resistance after moisture absorption | ○ | ○ | ○ |
| Observation of the presence of molding voids | ○ | ○ | ○ |
| Moldability | ○○ | ○○ | ○○ |
| Surface roughness (Ra) | ○ | ○ | ○ |
| Cracks | ○ | ○ | ○ |
| Plating peel | ○ | ○ | ○ |
| Heat shock test | ○ | ○ | ○ |

TABLE 3

|  | Comparative. Example. 5 | Comparative. Example. 6 |
|---|---|---|
| Epoxy resin (A) |  |  |
| Biphenyldimetylene type epoxy resin | 20.0 | 20.0 |
| Curing agent (B) | 0.2 | 0.2 |
| Phenoxy resin | 15.0 |  |
| Inorganic filler (C) | 39.6 | 39.6 |
| Novolac type cyanate resin | 25.0 | 40.0 |
| Epoxysilane coupling agent | 0.2 | 0.2 |
| Total | 100.0 | 100.0 |
| Evaluation Items |  |  |
| Linear expansion coefficient (ppm/° C.) | ○ 33 | ○ 30 |
| Solder heat resistance after moisture absorption | ○ | X |
| Observation of the presence of molding voids | ○ | X |
| Moldability | X | X |
| Surface roughness (Ra) | X | ○ |
| Cracks | X | X |
| Plating peel | ○ | X |
| Heat shock test | X | X |

|  | Comparative. Example. 7 | Comparative. Example. 8 |
|---|---|---|
| Epoxy resin (A) |  |  |
| Biphenyldimetylene type epoxy resin | 30.0 | 10.0 |
| Curing agent (B) | 0.2 | 0.2 |
| Phenoxy resin | 2.0 | 5.0 |
| Inorganic filler (C) | 39.6 | 69.4 |
| Novolac type cyanate resin | 28.0 | 15.0 |
| Epoxysilane coupling agent | 0.2 | 0.4 |
| Total | 100.0 | 100.0 |
| Linear expansion coefficient (ppm/° C.) | ○ 31 | ○ 22 |
| Solder heat resistance after moisture absorption | ○ | X |
| Observation of the presence of molding voids | ○ | X |
| Moldability | X | X |
| Surface roughness (Ra) | X | X |
| Cracks | X | X |
| Plating peel | X | X |
| Heat shock test | X | X |

|  | Comparative. Example. 9 |
|---|---|
| Epoxy resin (A) |  |
| Biphenyldimetylene type epoxy resin | 59.6 |
| Curing agent (B) | 0.4 |
| Phenoxy resin | 20.0 |
| Inorganic filler (C) |  |
| Novolac type cyanate resin | 20.0 |
| Epoxysilane coupling agent | 0.0 |
| Total | 100.0 |
| Evaluation Items |  |
| Linear expansion coefficient (ppm/° C.) | X 60 |
| Solder heat resistance after moisture absorption | ○ |
| Observation of the presence of molding voids | ○ |
| Moldability | ○○ |
| Surface roughness (Ra) | ○ |

TABLE 3-continued

| | |
|---|---|
| Cracks | X |
| Plating peel | X |
| Heat shock test | X |

Evaluation methods are as follows.

(1) Linear Expansion Coefficient

Two insulating resin sheets were laminated such that two insulating resin layer sides faced each other inside, and the laminate was molded under heating and pressure at a pressure of 2 MPa and a temperature of 200° C. for 2 hours using a vacuum press, and then a base material (PET film) was peeled off to prepare a resin cured product. The resulting resin cured product was cut into a test piece with a size of 4 mm×20 mm, for which a linear expansion coefficient was determined using a TMA (thermo-mechanical analysis) apparatus (TA Instruments) at a temperature-increase rate of 10° C./min.

The symbols indicate the followings.

○: less than 35 ppm/° C. (a linear expansion coefficient (an average linear expansion coefficient) within the range of 25° C. to 100° C.);

×: 35 ppm/° C. or more (a linear expansion coefficient (an average linear expansion coefficient) within the range of 25° C. to 100° C.).

(2) Solder Heat Resistance After Moisture Absorption

The multilayer printed wiring board C was cut into a size of 50 mm×50 mm, which was then one-side etching in accordance with JIS C 6481 to prepare a test piece. After being processed by a pressure cooker at 121° C. for 2 hours, it was floated on a solder bath at 260° C. such that the copper foil side was down and after 120 sec, the presence of apparent defects was determined.

○: No defects;

×: Swelling.

(3) Observation of the Presence of Molding Voids

For the insulating resin layer in the multilayer printed wiring board C, the presence of molding voids were visually observed.

The symbols indicate the followings.

○: No molding voids;

×: Molding void observed.

(4) Moldability

The surface of the insulating resin layer in the multilayer printed wiring board C was visually observed for the presence of a streak derived from separation of the inorganic component and the resin component.

The symbols indicate the followings.

○○: An average length of streaks is less than 4 mm;

○: 4 mm or more and less than 8 mm;

×: 8 mm or more.

(5) Surface Roughness (Ra)

For the substrate after the roughening in the process for manufacturing the multilayer printed wiring board D, a surface roughness (Ra) was determined using a noncontact three-dimensional optical interferotype surface roughness meter (Nihon Veeco K. K., WYKO NT1100).

The symbols indicate the followings.

○: 0.7 μm or less;

×: 0.7 μm or more.

(6) Cracks

For the substrate surface after roughening of the multilayer printed wiring board, the presence of cracks (resin break) was observed by SEM (scanning electron microscopy), and when cracks were observed, their depth was determined by laser microscopy.

○: Cracks with a size of less than 2 μm

×: Cracks with a size of 2 μm or more.

(7) Plating Peel

In the process for manufacturing the multilayer printed wiring board D, a part of the multilayer printed wiring board was removed, and a circuit was formed in the insulating resin layer and a peel-strength between the circuit and the insulating resin layer was determined in accordance with JIS C-6481.

○: 0.6 kN/m or more;

×: less than 0.6 kN/m.

(8) Heat Shock Test

The semiconductor device prepared above was treated in Fluorinert 1000 cycles where one cycle is at −55° C. for 30 min and at 125° C. for 30 min, and the presence of cracks in the semiconductor device was checked.

○: No defects;

×: Cracks.

Examples 16 to 21, which employed a resin composition of the present invention, exhibited good evaluation results in general, and exhibited good in-plane uniformity of surface asperity formed by roughening. Therefore, it can be supposed that heat shock test for the semiconductor device would give good results. In contrast, among Comparative Examples 5 to 9, which did not employ a methoxynaphthalene dimethylene type epoxy resin, Comparative Examples 5 to 8 demonstrated a separation between the inorganic filler and the resin component in the periphery and deteriorated in-plane uniformity of surface asperity formed by the roughening process. Therefore, it can be supposed that heat shock test for the semiconductor device would give poor results. In Comparative Example 9, which did not employ an inorganic filler, the roughening process was insufficient, leading to lower strength in plating peel measurement and to poor results in heat shock test for the semiconductor device. Although as a cyanate resin (D), a novolac type cyanate resin has been used in the above examples, another cyanate resin may be used to obtain comparable results.

The invention claimed is:

1. An epoxy resin composition comprising, as essential components, an epoxy resin (A) having a structure represented by general formula (1), a curing agent (B), an inorganic filler (C), and a cyanate resin and/or a prepolymer of the cyanate resin (D),

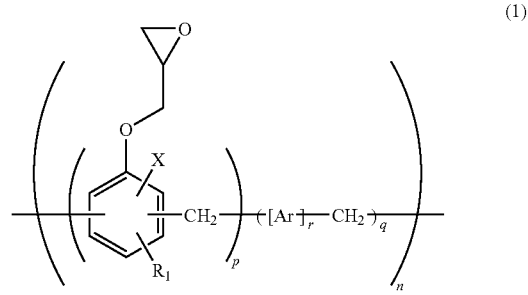

(1)

wherein Ar represents a substituted fused aromatic hydrocarbon group; r is an integer of 1 or more; X represents a hydrogen or an epoxy group (glycidyl ether group); $R_1$ represents one selected from the group consisting of a hydrogen, a methyl group, an ethyl group, a propyl group, a butyl group, a phenyl group and a benzyl group; n is an integer of 1 or more; each of p and q is an integer of 1 or more; p's and q's in respective repeating units may be the same as or different from one another, and wherein the substituted fused aromatic hydrocarbon group [Ar] in said epoxy resin (A) having the structure represented by general formula (1) is one selected from the group consisting of the structures represented by formulas (Ar1) to (Ar4),

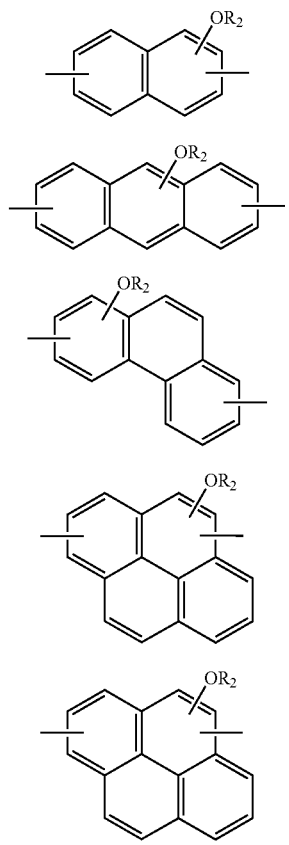

wherein $R_2$ represents one selected from the group consisting of a hydrogen atom, a methyl group, an ethyl group, a propyl group, a butyl group, a phenyl group and a benzyl group.

2. The epoxy resin composition as claimed in claim 1, wherein said inorganic filler (C) is at least one selected from the group consisting of magnesium hydroxide, aluminum hydroxide, silica, talc, calcined talc and alumina.

3. The epoxy resin composition as claimed in claim 1, wherein a content of (A) said epoxy resin is 1% by weight to 20% by weight to the total amount of the resin composition.

4. The epoxy resin composition as claimed in claim 1, wherein the epoxy resin composition has a minimum melt viscosity of $2 \times 10^2$ (Pa·s) or less.

5. The epoxy resin composition as claimed in claim 1, wherein a content of said inorganic filler (C) is 20% by weight to 85% by weight to the total amount of the resin composition.

6. The epoxy resin composition as claimed in claim 1, wherein said cyanate resin (D) is a novolac type cyanate resin.

7. The epoxy resin composition as claimed in claim 1, wherein a content of said cyanate resin and/or prepolymer of the cyanate resin (D) is 3% by weight to 46% by weight to the total amount of the resin composition.

8. A prepreg prepared by impregnating a base material with the epoxy resin composition as claimed in claim 1.

9. A laminated board prepared by laminating one or more of the prepregs as claimed in claim 8.

10. A multilayer printed wiring board comprising the laminated board as claimed in claim 9.

11. A multilayer printed wiring board comprising the prepreg as claimed in claim 8.

12. A semiconductor device comprising the multilayer printed wiring board as claimed in claim 11.

13. An epoxy resin composition for sheet comprising, as essential components, an epoxy resin (A) having a structure represented by general formula (1), a curing agent (B), an inorganic filler (C) and a cyanate resin and/or a prepolymer of the cyanate resin (D),

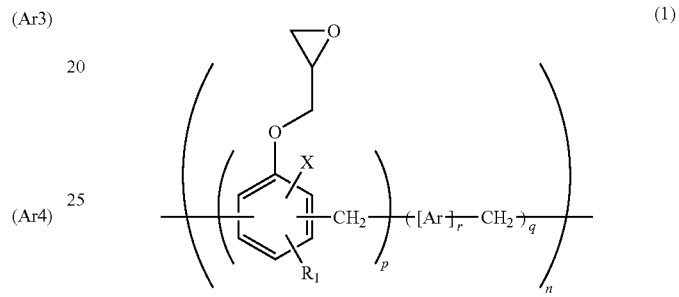

(1)

wherein Ar represents a substituted fused aromatic hydrocarbon group; r is an integer of or more; X represents a hydrogen or an epoxy group (glycidyl ether group); $R_1$ represents one selected from the group consisting of a hydrogen, a methyl group, an ethyl group, a propyl group, a butyl group, a phenyl group and a benzyl group; n is an integer of 1 or more; each of p and q is an integer of 1 or more; p's and q's in respective repeating units may be the same as or different from one another, and wherein the substituted fused aromatic hydrocarbon group [Ar] in said epoxy resin (A) having the structure represented by general formula (1) is one selected from the group consisting of the structures represented by formulas (Ar1) to (Ar4),

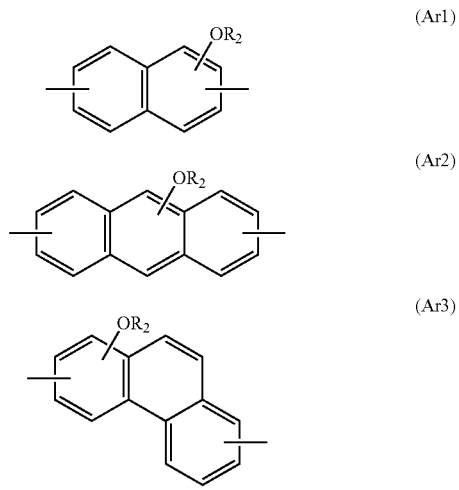

-continued

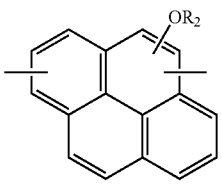
(Ar4)

wherein $R_2$ represents one selected from the group consisting of a hydrogen atom, a methyl group, an ethyl group, a propyl group, a butyl group, a phenyl group and a benzyl group.

14. An insulating resin sheet prepared by forming an insulating resin layer made of a resin composition comprising, as essential components, an epoxy resin (A) having a structure represented by general formula (1), a curing agent (B), an inorganic filler (C) and a cyanate resin and/or a prepolymer of the cyanate resin (D), over a carrier film or metal foil,

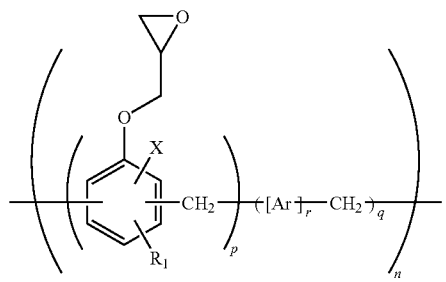
(1)

wherein Ar represents a substituted fused aromatic hydrocarbon group; r is an integer of 1 or more; X represents a hydrogen or an epoxy group (glycidyl ether group); $R_1$ represents one selected from the group consisting of a hydrogen, a methyl group, an ethyl group, a propyl group, a butyl group, a phenyl group and a benzyl group; n is an integer of 1 or more; each of p and q is an integer of 1 or more; p's and q's in respective repeating units may be the same as or different from one another, and wherein the substituted fused aromatic hydrocarbon group [Ar] in said epoxy resin (A) having the structure represented by general formula (1) is one selected from the group consisting of the structures represented by formulas (Ar1) to (Ar4),

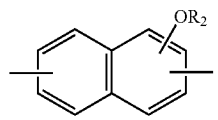
(Ar1)

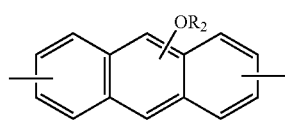
(Ar2)

-continued

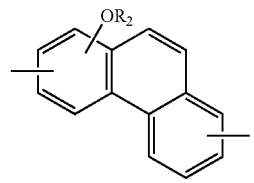
(Ar3)

(Ar4)

(Ar4)

wherein $R_2$ represents one selected from the group consisting of a hydrogen atom, a methyl group, an ethyl group, a propyl group, a butyl group, a phenyl group and a benzyl group.

15. The insulating resin sheet as claimed in claim 14, wherein said resin composition further comprises a phenoxy resin.

16. The insulating resin sheet as claimed in claim 14, wherein a content of said epoxy resin having the structure represented by general formula (1) (A) is 1% by weight to 20% by weight to the total amount of the resin composition.

17. The insulating resin sheet as claimed in claim 14, wherein said inorganic filler (C) is at least one selected from the group consisting of magnesium hydroxide, aluminum hydroxide, silica, talc, calcined talc and alumina.

18. The insulating resin sheet as claimed in claim 14, wherein a content of said inorganic filler (C) is 20% by weight to 85% by weight to the total amount of the resin composition.

19. A process for manufacturing a multilayer printed wiring board comprising
laminating the insulating resin sheet as claimed in claim 14 on a surface of an inner circuit board having an inner circuit pattern, and
forming an outer circuit in said insulating resin sheet.

20. The process for manufacturing a multilayer printed wiring board as claimed in claim 19, wherein said step of laminating is performed under heating and pressure in vacuo.

21. A multilayer printed wiring board comprising the insulating resin sheet as claimed in claim 14 laminated to a surface of an inner circuit board having a circuit pattern.

22. A semiconductor device comprising the multilayer printed wiring board as claimed in claim 21, in which a semiconductor element is mounted.

* * * * *